(12) United States Patent
Nakajima et al.

(10) Patent No.: US 7,139,638 B2
(45) Date of Patent: Nov. 21, 2006

(54) SUBSTRATE PROCESSING UNIT, METHOD FOR DETECTING THE POSITION OF A SUBSTRATE AND SUBSTRATE PROCESSING APPARATUS

(75) Inventors: Toshihiro Nakajima, Kyoto (JP); Mitsuhiro Masuda, Kyoto (JP); Yasuhiro Shiba, Kyoto (JP); Yasuhiro Fukumoto, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 253 days.

(21) Appl. No.: 10/941,785

(22) Filed: Sep. 15, 2004

(65) Prior Publication Data

US 2005/0065634 A1    Mar. 24, 2005

(30) Foreign Application Priority Data

Sep. 19, 2003  (JP) ............................. 2003-329014
May 12, 2004  (JP) ............................. 2004-142105

(51) Int. Cl.
    *G06F 7/00*    (2006.01)
(52) U.S. Cl. ...................... 700/218; 700/213; 700/214; 414/217; 414/935; 414/936; 414/939
(58) Field of Classification Search ................ 700/213, 700/214, 218; 414/217, 935, 936, 939
    See application file for complete search history.

(56) References Cited

U.S. PATENT DOCUMENTS 3,797,889 A * 3/1974  Wilkinson ................... 406/34
4,764,076 A * 8/1988  Layman et al. ............. 414/217
5,677,824 A * 10/1997 Harashima et al. ......... 361/234
6,104,002 A * 8/2000  Hirose et al. ............... 219/390
6,168,668 B1 * 1/2001  Yudovsky .................... 118/715
6,267,545 B1 * 7/2001  Mooring et al. ............ 414/217
6,402,400 B1   6/2002  Ueda et al. ................. 396/611
6,402,401 B1   6/2002  Ueda et al. ................. 396/611
6,676,365 B1 * 1/2004  Adam et al. .................. 406/83
6,898,064 B1 * 5/2005  Berman et al. ............. 361/234

FOREIGN PATENT DOCUMENTS

JP    2001-189368    7/2001

* cited by examiner

*Primary Examiner*—Khoi H. Tran
(74) *Attorney, Agent, or Firm*—Ostrolenk, Faber, Gerb & Soffen, LLP

(57) ABSTRACT

A thermal processing unit is connected to a substrate position detector, which is in turn connected to a bake unit controller. The thermal processing unit includes a temperature control plate and a lifting device. The temperature control plate and lifting device are connected to the bake unit controller. The operations of the temperature control plate and lifting device are controlled by the bake unit controller. A pressure measuring pipe is provided at a lower part of at least one of a plurality of pin inserting holes in the temperature control plate. The pressure measuring pipe is connected to a low differential pressure sensor. The low differential pressure sensor detects the pressure in an airflow exhausted from a space surrounded by a substrate and an upper face of the temperature control plate via the pressure measuring pipe.

20 Claims, 19 Drawing Sheets

F I G. 1
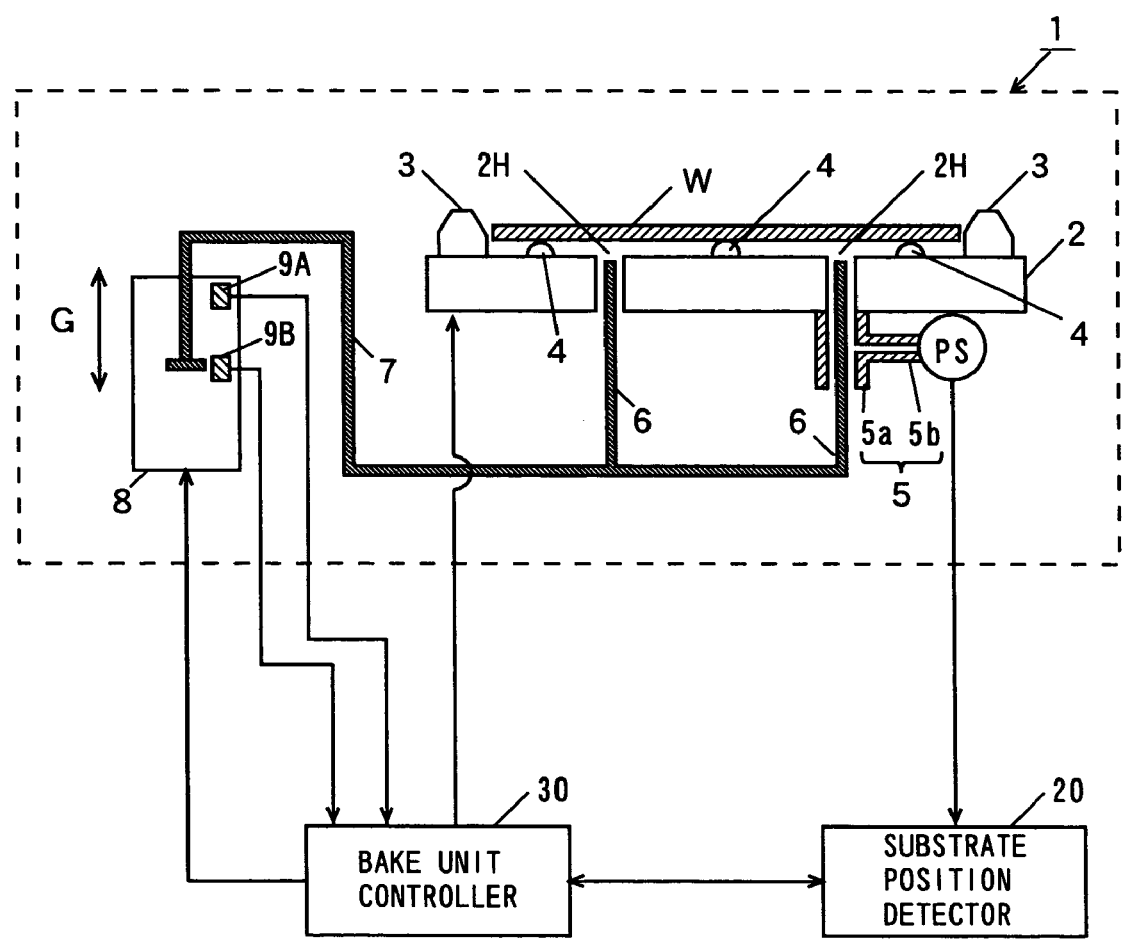

SUBSTRATE PROCESSING UNIT, METHOD FOR DETECTING THE POSITION OF A SUBSTRATE AND SUBSTRATE PROCESSING APPARATUS

BACKGROUND OF THE INVENTION

1. Field of the Invention

The present invention relates to a substrate processing unit for performing various processings to a substrate, a method for detecting the position of a substrate, and a substrate processing apparatus.

2. Description of the Background Art

A substrate heating apparatus for heat-treating a substrate has been conventionally used in processing steps of a variety of substrates, such as a semiconductor wafer, glass substrate for a photomask, glass substrate for a liquid crystal display, and glass substrate for an optical disc (refer to JP 2001-189368 A, for example).

In the substrate heating apparatus, the substrate is placed on a heating plate for heat-treatment. During the heat-treatment, it is desired that the temperature of the entire substrate be varied uniformly. This improves accuracy of the processing steps.

For the purpose of improving accuracy of the processing steps, following solutions have been proposed.

For example, by providing a lid that covers the substrate above the heating plate, the substrate to be processed is prevented from being exposed to an airflow coming from above the substrate heating apparatus (downflow). The temperature of the entire substrate during the heat-treatment is therefore not affected by the downflow.

Moreover, when atmosphere during the heat-treatment is reduced, the substrate is prevented from being in contact with an unnecessary gas and reacting.

In addition to such solutions, it is required that the substrate be accurately placed during the heat-treatment. If the substrate is placed in a shifted position on the heating plate, part of the substrate lies out of the heating plate. As a result, the entire substrate may not be uniformly heat-treated.

By the way, a method for directly detecting the position of the substrate using an optoelectronic sensor, proximity sensor or the like has been conventionally used for knowing how the substrate is being transported or placed. This has led to attempts to obtain some information about the position of the substrate on the heating plate using an optoelectronic sensor, proximity sensor or the like.

It has been difficult however, in the above described heat-treatment apparatus, to install an optoelectronic sensor or proximity sensor to know the substrate position, because of the influence of heat from the heating plate or constraints and interference associated with the layout of other peripheral units in the substrate heating apparatus.

Apart from the optoelectronic sensor or proximity sensor, sensors such as a high heat-resistant optoelectronic sensor, weight measuring sensor for measuring the mass of the substrate, and temperature measuring sensor for detecting a temperature variation in the substrate heating apparatus are available; however, applying any of these to detect the substrate position in the substrate heating apparatus has been difficult because of problems associated with the space, cost necessary to install a plurality of sensors, sensor accuracy and the like.

For this reason, in a conventional substrate heating apparatus, positioning guides with a tapered portion are provided around the position in which the substrate is to be placed on a heating plate so as to prevent the substrate position from being shifted. In this case, even if the substrate is received in a shifted position, a peripheral edge of the substrate is guided by the tapered portion of a positioning guide, so that the substrate can be guided to a given position on the heating plate.

Thus, in the substrate heating apparatus, the substrate is heat-treated on the premise that it is placed in an accurate position by the positioning guides.

However, in the substrate heating apparatus with the positioning guides around the position in which the substrate is to be placed on the heating plate, the substrate may lie on a positioning guide when it is greatly shifted beyond a given range (such that the periphery thereof may lie beyond the tapered portion). In this case, the substrate is not guided to the given position on the heating plate, and heat-treated while being in a shifted position. As a result, the entire substrate is not uniformly heat-treated.

SUMMARY OF THE INVENTION

It is an object of the present invention is to provide a substrate processing unit, a method for detecting the position of a substrate, and a substrate processing apparatus which are capable of detecting a substrate shifted position with a simple structure.

A substrate processing unit according to one aspect of the present invention for performing a given processing to a substrate comprises: a substrate support plate on which a substrate is placed; a lifting device that lifts and lowers the substrate above the substrate support plate; a detector that detects a variation in the airflow in a space between the substrate and the substrate support plate when the substrate is lifted or lowered by the lifting device; and a determiner that determines the position of the substrate on the substrate support plate based on the variation in the airflow detected by the detector.

In the substrate processing unit, the substrate is lifted or lowered by the lifting device above the substrate support plate. A variation in the airflow in the space between the substrate and substrate support plate when the substrate is lifted or lowered by the lifting device is then detected by the detector, and the position of the substrate on the substrate support plate is determined by the determiner based on the detected variation in the airflow.

The position of the substrate can thus be determined based on the variation in the airflow caused by lifting or lowering the substrate, so that a substrate shifted position can be detected with a simple structure.

The detector may include a pressure detector that detects a pressure variation due to the variation in the airflow. In this case, a pressure variation is detected by the pressure detector, so that a substrate shifted position can be detected with a simple structure.

The pressure detector may be a differential pressure sensor for detecting a pressure difference between a first space and a second space, the first space may be a space between the substrate support plate and the substrate, and the second space may be a space communicating with the first space.

In this case, since the first space and the second space communicate with each other, a pressure difference between the first and second spaces will not become excessive. As a result, a breakage of the differential pressure sensor due to an excessive pressure difference is prevented.

The substrate processing unit may further comprise a sealing container that houses the substrate support plate and an exhaust pipe for exhausting atmosphere inside the sealing container, the second space being a space inside the exhaust pipe. In this case, the atmosphere inside the sealing container is exhausted via the exhaust pipe. This results in a pressure reduction inside the sealing container.

In addition, since the first space and the second space inside the exhaust pipe communicate with each other, a pressure difference between them will not become excessive. As a result, a breakage of the differential pressure sensor due to an excessive pressure difference is prevented.

The substrate processing unit may further comprise a sealing container that houses the substrate support plate and an exhaust pipe for exhausting atmosphere in the sealing container, the second space being a space inside the sealing container except the space between the substrate support plate and the substrate. In this case, the atmosphere inside the sealing container is exhausted via the exhaust pipe. This results in a pressure reduction inside the sealing container.

In addition, since the first and second spaces are both included in the space inside the sealing container, a pressure difference between the first and second spaces will not become excessive. As a result, a breakage of the differential pressure sensor due to an excessive pressure difference is prevented.

The detector may include a flow rate detector that detects a flow rate variation due to the variation in the airflow. In this case, a flow rate variation is detected by the flow rate detector, so that a substrate shifted position can be detected with a simple structure.

The substrate support plate may have a vertically penetrating throughhole, and the detector may detect a variation in the airflow passing through the through hole when the substrate is lifted or lowered by the lifting device.

In this case, a variation in the airflow passing through the through hole in the substrate support plate is detected by the detector. This makes it possible to detect a substrate shifted position with a simple structure.

The substrate support plate may have a plurality of vertically penetrating through holes, the lifting device may include: a plurality of support members provided so as to vertically move in the plurality of through holes; and a driving device that lifts and lowers the plurality of support members, and the detector may detect a variation in the airflow passing through at least one of the plurality of through holes when the plurality of support members are lifted or lowered by the driving device.

In this case, the plurality of support members are lifted and lowered by the driving device in the plurality of through holes so that the substrate is lifted and lowered. Variations in the airflows passing through the through holes when the plurality of support members are lifted or lowered are then detected by the detector. This makes it possible to detect a substrate shifted position with a simple structure without the need to provide additional gas path for detecting variations in the airflows.

The substrate support plate may have a plurality of vertically penetrating through holes, the lifting device may include: a plurality of support members provided so as to vertically move in the plurality of through holes; and a driving device that lifts and lowers the plurality of support members, at least one of the support members may have a path that opens to the space between the substrate support plate and the substrate, and the detector may detect a variation in the airflow passing through the path when the plurality of support members are lifted or lowered by the driving device.

In this case, the plurality of support members are lifted and lowered by the driving device in the plurality of through holes so that the substrate is lifted and lowered.

Then, a variation in the airflow passing through the path when the plurality of support members are lifted or lowered is detected by the detector. This makes it possible to detect a substrate shifted position with a simple structure without the need to provide additional gas path for detecting a variation in the airflow.

The detector may include at least one sensor that detects a pressure or a flow rate, the substrate processing unit may further comprise: a processor that processes a signal output from the at least one sensor; and a controller that determines the position of the substrate on the substrate support plate based on a processing result from the processor while controlling the lifting and lowering operation by the lifting device.

In this case, a pressure or a flow rate is detected by the at least one sensor, the signal output from the at least one sensor is processed by the processor, the lifting and lowering operation is controlled by the controller, and the position of the substrate on the substrate support plate is determined based on the processing result from the processor.

The separate provision of processor and controller makes it possible to detect the position of the substrate without increasing the burden of the controller.

A plurality of the sensors may be provided, the processor may process signals output from the plurality of sensors, and the controller may determine the position of the substrate on the substrate support plate based on a plurality of processing results obtained from the processor.

In this case, the signals output from the plurality of sensors are processed by the processor, and the position of the substrate is determined by the controller based on the plurality of processing results. The position of the substrate is thus determined based on the processing results of the signals output from the plurality of sensors, leading to higher precision in determining the position of the substrate.

The controller may determine whether or not the substrate is normally placed on the substrate support plate based on the plurality of processing results obtained from the processor, and determine that the substrate is normally placed on the substrate support plate, when all of the plurality of processing results are normal.

In this case, variations in the airflow in the space between the substrate and substrate support plate are detected by the plurality of sensors, and the position of the substrate is determined based on each of the plurality of signals output from the plurality of sensors, thus leading to higher precision in determining the position of the substrate. This makes it possible to detect not only a substrate shifted position but also a processing abnormality of the substrate placed on the substrate support plate.

The processor may compare the signal output from the at least one sensor with a prescribed threshold value to output a comparison signal representing a comparison result, and the controller may determine the position of the substrate on the substrate support plate based on the comparison signal output from the processor.

In this case, the signal output from the at least one sensor is compared with the prescribed threshold value by the processor for output of the comparison signal. In addition, the position of the substrate on the substrate support plate is determined by the controller based on the comparison signal. This makes it possible to detect a substrate shifted position with a simple structure.

The processor may perform a moving average processing to the signal output from the at least one sensor to compare a processed output signal with the threshold value. In this case, the signal output from the at least one sensor undergoes the moving average processing by the processor. This results in reduced noise in the signal output from the at least one sensor.

The processor may compare the signal output from the at least one sensor and the threshold value, and perform a delay filter processing to the compared signal output from the at least one sensor.

In this case, the signal output from the at least one sensor which has been compared with the threshold value undergoes the delay filter processing by the processor. This prevents the generation of an erroneous comparison signal.

The substrate support plate may include a temperature controller that controls the substrate to a given processing temperature, and the processor may perform the delay filter processing based on a delay time corresponding to the processing temperature.

Note that a signal output from the sensor varies depending on the processing temperature of the substrate. In this case, the temperature of the substrate placed on the substrate support plate is controlled to a given processing temperature by the temperature controller. The delay filter processing is then performed by the processor based on the delay time corresponding to the processing temperature.

The position of the substrate on the substrate support plate is thus determined in accordance with the substrate processing temperature.

The substrate processing unit may further comprise a setter for setting the delay time in accordance with the processing temperature, the processor performing the delay filter processing based on the delay time set by the setter.

In this case, the delay time corresponding to the processing temperature is set by the setter, and the delay filter processing based on the set delay time is performed by the processor.

The controller may reset the comparison signal from the processor to a given state prior to lifting or lowering of the plurality of support members by the driving device, and receive the comparison signal from the processor after lifting or lowering of the plurality of support members by the driving device.

In this case, the comparison signal from the processor is reset to a given state by the controller prior to lifting or lowering of the plurality of support members, and the comparison signal is received by the controller from the processor after lifting or lowering of the plurality of support members. This allows the comparison signal to be easily obtained.

A method for detecting the position of a substrate according to another aspect of the present invention, in which the position of a substrate on a substrate support plate is detected, comprises the steps of: lifting or lowering a substrate above the substrate support plate; detecting a variation in the airflow in a space between the substrate and the substrate support plate when the substrate is lifted or lowered; and determining the position of the substrate on the substrate support plate based on the detected variation in the airflow.

In the method for detecting the position of a substrate, the substrate is lifted or lowered above the substrate support plate. Then, a variation in the airflow in the space between the substrate and substrate support plate when the substrate is lifted or lowered is detected, followed by a determination of the position of the substrate on the substrate support plate based on the detected variation in the airflow.

In this manner, the position of the substrate is determined based on a variation in the airflow caused by lifting or lowering the substrate, so that a substrate shifted position can be detected with a simple structure.

A substrate processing apparatus according to still another aspect of the present invention comprises: a substrate processing unit for performing a given processing to a substrate; and a transport device that carries the substrate into and out of the substrate processing unit, the substrate processing unit comprising: a substrate support plate on which the substrate is placed; a lifting device that lifts and lowers the substrate above the substrate support plate; detector that detects a variation in the airflow in a space between the substrate and the substrate support plate when the substrate is lifted or lowered by the lifting device; and a determiner that determines the position of the substrate on the substrate support plate based on the variation in the airflow detected by the detector.

In the substrate processing apparatus, the substrate is carried into and out of the substrate processing unit by the transport device. The substrate is also lifted or lowered by the lifting device above the substrate support plate in the substrate processing unit of the substrate processing apparatus. Then, a variation in the airflow in the space between the substrate and substrate support plate when the substrate is lifted or lowered by the lifting device is detected, followed by a determination of the position of the substrate on the substrate support plate by the determiner based on the detected variation in the airflow.

In this manner, the position of the substrate can be determined based on a variation in the airflow caused by lifting or lowering the substrate, so that a substrate shifted position can be detected with a simple structure.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic diagram showing an example of the structure of a thermal processing unit according to a first embodiment;

DESCRIPTION OF THE PREFERRED EMBODIMENTS

Figure 2:
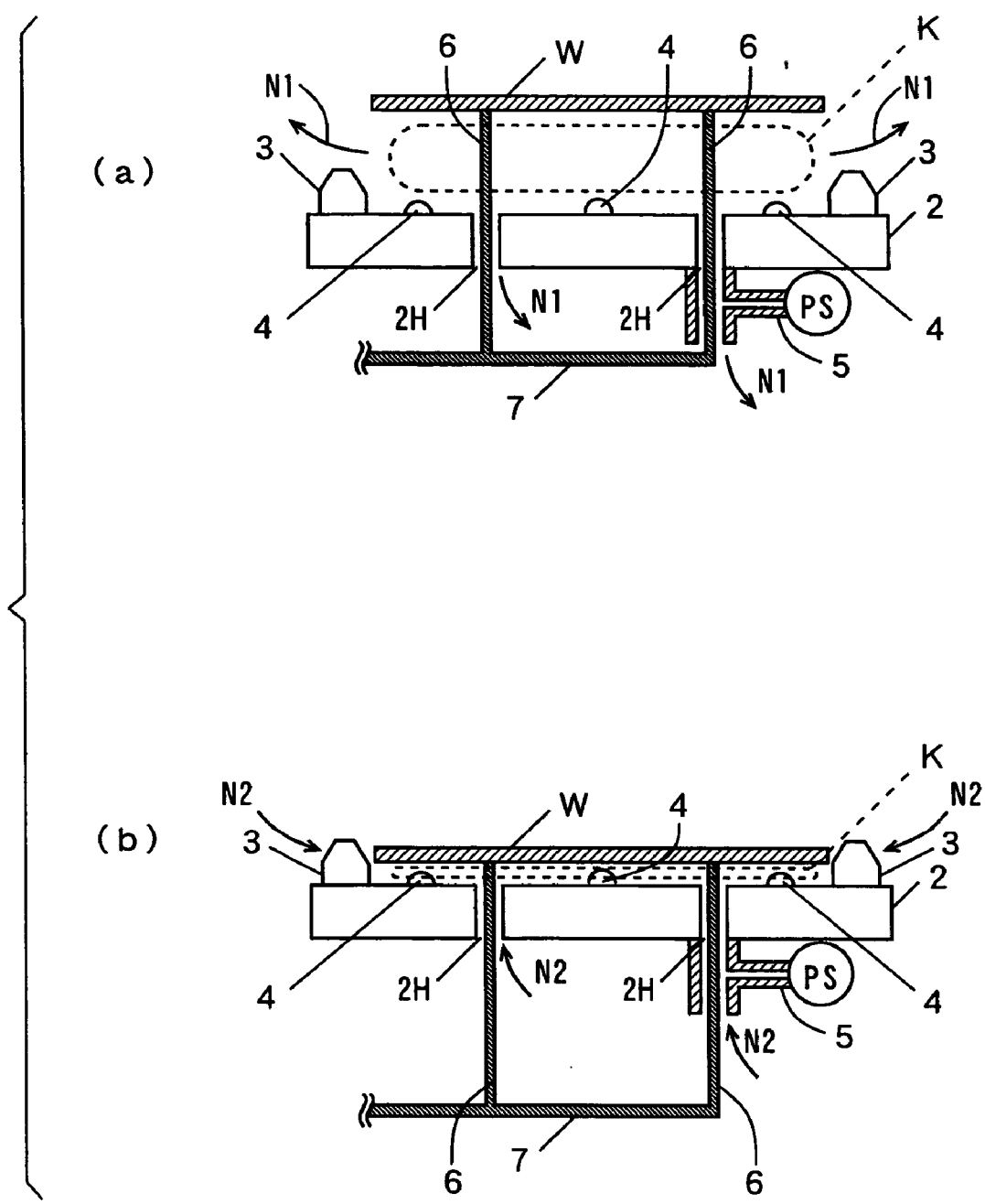
FIG. 2 is a schematic diagram showing a substrate being placed normally in a given position on the temperature control plate.

Description will, hereinafter, be made of a substrate processing unit, a method for detecting the position of a substrate, and a substrate processing apparatus according to an embodiment of the present invention with reference to FIGS. 1 through 20.

(First Embodiment)

A substrate in the following description refers to a semiconductor wafer, a glass substrate for a liquid crystal display, a glass substrate for a PDP (Plasma Display Panel), a glass substrate for a photomask, a substrate for an optical disc or the like.

As for the substrate processing unit, a thermal processing unit for thermally treating a substrate will be taken as an example.

FIG. 1 is a schematic diagram showing an example of the structure of a thermal processing unit according to a first embodiment.

As shown in FIG. 1, the thermal processing unit 1 according to the first embodiment is connected to a substrate position detector 20, which is in turn connected to a bake unit controller 30. The bake unit controller 30 is connected to a host controller, alarm device or the like (not shown).

The thermal processing unit 1 includes a temperature control plate 2 and a lifting device 8. The temperature control plate 2 and the lifting device 8 are connected to the bake unit controller 30. The operations of the temperature control plate 2 and lifting device 8 are thus controlled by the bake unit controller 30.

A plurality of positioning members (positioning guides) 3 are arranged at equal intervals on an upper periphery of the temperature control plate 2 so that a substrate W may not be shifted from its position when placed on the temperature control plate 2. The number of the positioning members 3 is, for example, three.

A plurality of hemisphere-like substrate support pieces 4 are arranged in a distributed manner around the center of the upper face of the temperature control plate 2 in order to support the substrate W during thermal treatment. The number of the substrate support pieces 4 is, for example, ten.

A plurality of pin inserting holes 2H are formed at almost equal intervals on a given concentric circle around the center of the temperature control plate 2. The number of the pin inserting holes 2H is, for example, three.

Substrate lifting pins 6 are inserted from below the temperature control plate 2 into the respective pin inserting holes 2H. Note that the inside diameter of the pin inserting hole 2H is set greater than the outer diameter of the substrate lifting pin 6 with a gap being formed between the pin inserting hole 2H and the substrate lifting pin 6. Moreover, when the substrate W is placed on the substrate support pieces 4 of the temperature control plate 2 as shown in FIG. 1, upper ends of the plurality of substrate lifting pins 6 are in such a position that they avoid contact with a lower face of the substrate W.

Lower ends of the plurality of substrate lifting pins 6 are coupled with each other through a coupling member 7. The coupling member 7 couples the plurality of substrate lifting pins 6, and can also be lifted and lowered by the lifting device 8, as indicated by the arrow G.

The lifting device 8 thus lifts and lowers the coupling member 7 at a given timing. This causes the plurality of substrate lifting pins 6 coupled to the coupling member 7 to be lifted and lowered.

When the substrate W is received, the lifting device 8 lifts the coupling member 7. This causes the plurality of substrate lifting pins 6 to be lifted, projecting to a given height from the pin inserting hole 2H in the temperature control plate 2.

At the time, the substrate W transported from a transport device (not shown) is supported by the upper ends of the substrate lifting pins 6 projecting to the given height.

The lifting device 8 subsequently lowers the coupling member 7. This causes the substrate lifting pins 6 projecting to the given height to be lowered to a height below the substrate holding piece 4. The substrate W which has been supported by the upper ends of the substrate lifting pins 6 is now supported by the plurality of substrate support pieces 4.

When the substrate W is to be transferred, the lifting device 8 again lifts the coupling member 7. This causes the plurality of substrate lifting pins 6 to be lifted to project to the given height from the pin inserting hole 2H in the temperature control plate 2.

The substrate W which has been supported by the substrate support pieces 4 is then supported by the substrate lifting pins 6 to be lifted to the given height. The lifted substrate W is transferred by the transport device (not shown).

An upper sensor 9A and a lower sensor 9B are provided inside the lifting device 8. The upper sensor 9A switches on when the coupling member 7 is lifted to the given height by the lifting device 8, and switches off when the coupling member 7 is lowered. Meanwhile, the lower sensor 9B switches on when the coupling member is lowered to a given height by the lifting device 8, and switches off when the coupling member 7 is lifted.

The upper sensor 9A and lower sensor 9B are connected to the bake unit controller 30 to supply a signal representing the ON/OFF described above (up/down determination signal) to the bake unit controller 30. This allows the bake unit controller 30 to recognize whether the substrate lifting pins 6 are lifted or lowered.

A pressure measuring pipe(s) 5 is provided at a lower part of at least one of the plurality of pin inserting holes 2H in the temperature control plate 2. The pressure measuring pipe 5 consists of a straight pipe 5a with a larger diameter and a branch pipe 5b with a smaller diameter. One end of the straight pipe 5a is attached to a lower end of the pin inserting hole 2H, i.e., a lower face of the temperature control plate 2.

The straight pipe 5a is formed in a given length to be coaxial with the pin inserting hole 2H, while maintaining the inside diameter of the pin inserting hole 2H. The branch pipe 5b is provided at the center part of the straight pipe 5a in the length direction. The branch pipe 5b is connected to a low differential pressure sensor PS. Although the branch pipe 5b may be provided at a lower end of the straight pipe 5a, it is preferably provided above the center part thereof. Note that the branch pipe 5b is formed as an orifice.

The gap formed between the aforementioned pin inserting hole 2H and substrate lifting pin 6 and the branch pipe 5b thus communicate with each other. In other words, space surrounded by the substrate W and upper face of the temperature control plate 2, and the branch pipe 5b communicate with each other.

As a result, the low differential pressure sensor PS detects the pressure of an airflow exhausted from the space surrounded by the substrate W and upper face of the temperature control plate 2 via the branch pipe 5b. Note that the low differential pressure sensor PS may detect the pressure of an airflow supplied to the space surrounded by the substrate W and upper face of the temperature control plate 2 via the branch pipe 5b.

The low differential pressure sensor PS supplies a pressure signal corresponding to the pressure in the branch pipe 5b to the substrate position detector 20.

The substrate position detector 20 generates a comparison detecting value signal described later based on the pressure signal supplied from the low differential pressure sensor PS for supply to the bake unit controller 30.

The bake unit controller 30 supplies a comparison detecting value reset signal described later to the substrate position detector 20.

Additionally, the bake unit controller 30 supplies a signal for giving an alarm (alarm signal) to the host controller, alarm device or the like (not shown) based on the comparison detecting value signal supplied from the substrate position detector 20. Note that the bake unit controller 30 may have the alarm device. In this case, the bake unit controller 30 gives an alarm based on the alarm signal. The alarm may be audibly given through a sound such as buzzer, or visually given through illumination of a lamp or the like.

Description will be made of a small pressure fluctuation that occurs in the space surrounded by the substrate W and upper face of the temperature control plate 2, i.e., pressure fluctuation in the aforementioned branch pipe 5b when the substrate W is placed on the temperature control plate 2 or transferred from the temperature control plate 2.

FIG. 2 is a schematic diagram showing the substrate W being placed normally in a given position on the temperature control plate 2. Here, the given position on the temperature control plate 2 refers to a position in which the whole surface of the substrate W can be uniformly thermally treated by the temperature control plate 2, with the substrate W lying between the plurality of positioning members 3.

As shown in FIG. 2(a), for example, the substrate W carried into the thermal processing unit 1 is supported by the substrate lifting pins 6 which are being lifted. Then, the substrate lifting pins 6 are lowered to compress the atmosphere in a space K formed between the substrate W and upper face of the temperature control plate 2, resulting in an increase in the pressure.

This induces airflows in the gap between the periphery of the substrate W and temperature control plate 2 and in the gap between the pin inserting hole 2H and substrate lifting pin 6, as indicated by the arrows N1, respectively. An airflow is also induced in the gap between the pressure measuring pipe 5 and substrate lifting pin 6 as indicated by the arrow N1. As a result, the pressure in the pressure measuring pipe 5 is increased.

An increase in the pressure in the pressure measuring pipe 5 depends on the size of each of the aforementioned gaps, area of the substrate W, and speed at which the substrate lifting pins 6 are lowered.

After that, the substrate W is supported by the substrate support pieces 4, so that the pressure in the space K becomes identical to the peripheral pressure in the thermal processing unit 1.

As shown in FIG. 2(b), on the other hand, the substrate W placed in the thermal processing unit 1 is supported by the substrate support pieces 4 with the substrate lifting pins 6 being lowered. As the substrate lifting pins 6 are lifted, the substrate W being supported by the substrate lifting pins 6 is also lifted. As a result, the atmosphere in the space K formed between the substrate W and upper face of the temperature control plate 2 becomes a negative pressure to decrease the pressure.

This induces airflows in the gap between the periphery of the substrate W and periphery of the temperature control plate 2 and in the gap between the pin inserting hole 2H and substrate lifting pin 6, as indicated by the arrows N2, respectively. An airflow is also induced in the gap between the pressure measuring pipe 5 and substrate lifting pin 6, as indicated by the arrow N2. As a result, the pressure in the pressure measuring pipe 5 is decreased.

A decrease in the pressure in the pressure measuring pipe 5 depends on the size of each of the aforementioned gaps, area of the substrate W, and speed at which the substrate lifting pins 6 are lifted.

After that, the substrate lifting pins 6 stop being lifted so that the substrate W stops being lifted. This results in the pressure in the space K being identical to the peripheral pressure in the thermal processing unit 1.

When the substrate W is not placed normally in the given position on the temperature control plate 2, the pressure fluctuation in the space K surrounded by the substrate W and upper face of the temperature control plate 2 differs from that when the substrate W is placed normally on the temperature control plate 2.

Figure 3:
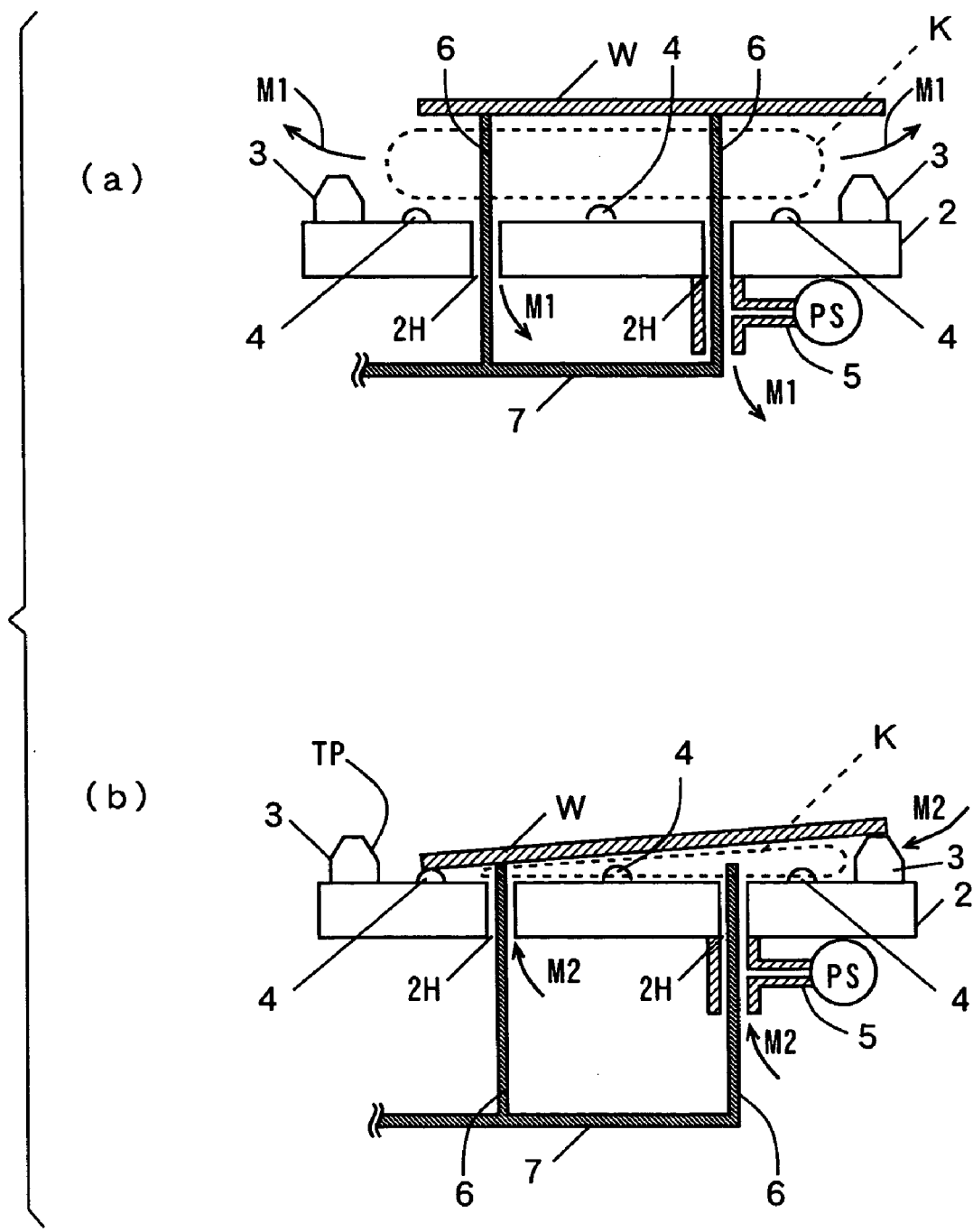
FIG. 3 is a schematic diagram showing the substrate which is not normally placed in the given position on the temperature control plate.

FIG. 3 is a schematic diagram showing the substrate W which is not normally placed in the given position on the temperature control plate 2.

As shown in FIG. 3, upper parts of the positioning members 3 have a tapered shape. Thus, the periphery of the substrate W placed on the temperature control plate 2 while slightly being shifted from its normal position is brought into contact with the tapered portion of a positioning member 3 to be guided to its normal position.

However, when the periphery of the substrate W is shifted beyond the tapered portion of the positioning member 3, part of the periphery of the substrate W may ride on the positioning member 3, as shown in FIG. 3(*b*). This is the case where the substrate W is not in its normal position.

Suppose, for example, that the substrate W carried into the thermal processing unit 1 is supported by the substrate lifting pins 6 while being shifted from its normal position, as in the case shown in FIG. 3(*a*). In this case, the substrate lifting pins 6 are lowered to compress the atmosphere in the space K formed between the substrate W and upper face of the temperature control plate 2, resulting in an increase in the pressure.

This induces airflows in the gap between the periphery of the substrate W and periphery of the temperature control plate 2 and in the gaps between the pin inserting holes 2H and substrate lifting pins 6, as indicated by the arrows M1, respectively. An airflow is also induced in the gap between the pressure measuring pipe 5 and substrate lifting pin 6 as indicated by the arrow M1. As a result, the pressure in the pressure measuring pipe 5 is increased.

However, when the substrate W is supported by the substrate lifting pins 6 while being shifted from its normal position so that the part of the periphery thereof rides on the positioning member 3, the substrate W is inclined on the temperature control plate 2. This causes airflow to easily flow to one side.

As a result, when the substrate W is lowered, an increase in the pressure in the pressure measuring pipe 5 is smaller than that when the substrate W is placed normally on the temperature control plate 2.

The substrate W is subsequently supported by the substrate support pieces 4, which results in the pressure in the space K being identical to the peripheral pressure in the thermal processing unit 1.

Suppose now, as shown in FIG. 3(*b*), that the part of the periphery of the substrate W rides on the positioning member 3 with the substrate lifting pins 6 being lowered. In this case, the substrate lifting pins 6 are lifted to support the substrate W so that the substrate W is lifted. As a result, the atmosphere in the space K formed between the substrate W and upper face of the temperature control plate 2 becomes a negative pressure to decrease the pressure.

This induces airflows in the gap between the periphery of the substrate W and periphery of the temperature control plate 2 and in the gaps between the pin inserting holes 2H and substrate lifting pins 6, as indicated by the arrows M2, respectively. An airflow is also induced in the gap between the pressure measuring pipe 5 and substrate lifting pin 6 as indicated by the arrow M2. As a result, the pressure in the pressure measuring pipe 5 is decreased.

However, when the substrate W is inclined on the temperature control plate 2, the airflow easily flows in from one side, compared with the case where the substrate W is normally placed on the temperature control plate 2.

As a result, when the substrate W is lifted, a decrease in the pressure in the pressure measuring pipe 5 is smaller than that when the substrate W is normally placed on the temperature control plate 2.

After that, the substrate lifting pins 6 stop being lifted so that the substrate W stops being lifted. This results in the pressure in the space K being identical to the peripheral pressure in the thermal processing unit 1.

In the first embodiment described above, the small pressure difference PS provided to the pressure measuring pipe 5 measures a pressure fluctuation in the space K of FIGS. 2 or 3 by detecting the pressure in the branch pipe 5*b*, thereby detecting a shift of the substrate W position when the substrate W is placed.

Comparison will now be made between a pressure fluctuation caused by lifting the substrate lifting pins 6 when the substrate W is normally placed on the temperature control plate 2 and a pressure fluctuation caused by lifting the substrate lifting pins 6 when the substrate W is shifted from its normal position on the temperature control plate 2 (with part of the periphery of the substrate W on the positioning member 3).

Figure 4:
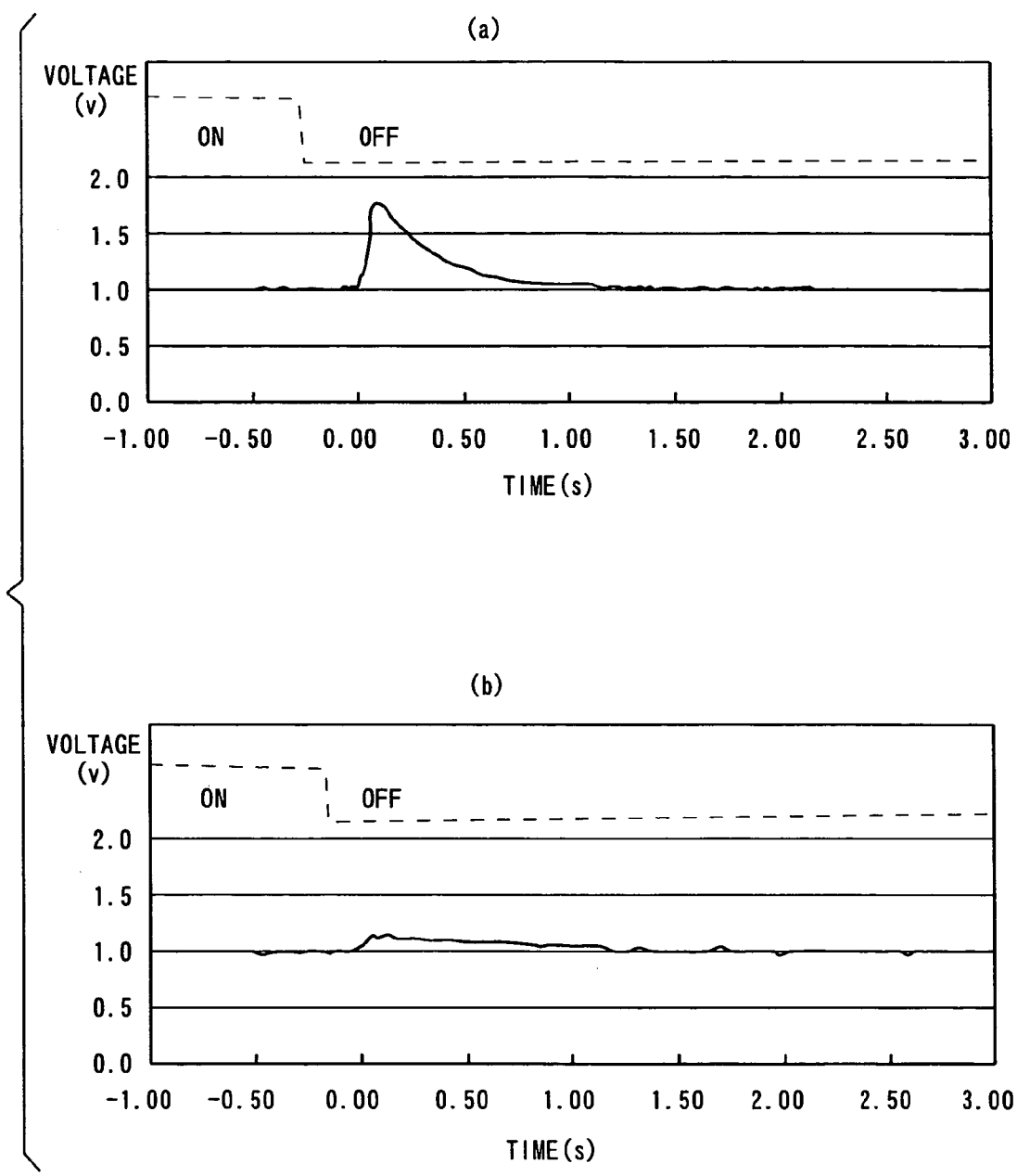
FIG. 4 is a graph for use in comparing a difference between pressure fluctuations caused by lifting the substrate when the substrate is normally placed on the temperature control plate and when the substrate is shifted from its normal position on the temperature control plate.

FIG. 4 is a graph for use in comparing a difference between pressure fluctuations caused by lifting the substrate W when the substrate W is normally placed on the temperature control plate 2 and when the substrate W is shifted from its normal position on the temperature control plate 2.

FIG. 4(*a*) shows a pressure fluctuation caused by lifting the substrate W when the substrate W is normally placed on the temperature control plate 2, and FIG. 4(*b*) shows a pressure fluctuation caused by lifting the substrate W when the substrate W is shifted from its normal position on the temperature control plate 2.

In FIGS. 4(*a*), (*b*), the ordinate represents voltage, and the abscissa represents time. The solid lines represent values (pressure signals) of the pressures in the branch pipe 5*b* caused by the pressure fluctuations in the space K of FIGS. 2 or 3 which are detected by the low differential pressure sensor PS. The broken lines of FIGS. 4(*a*), (*b*) represent ON/OFF (up/down determination signals) of the lower sensor 9B of FIG. 1. As mentioned above, as the substrate lifting pins 6 supporting the substrate W start being lifted, the up/down determination signal of the lower sensor 9B switches from ON to OFF.

When the substrate W is normally placed on the temperature control plate 2 as in the case of FIG. 4(*a*), the pressure signal of the low differential pressure sensor PS increases, after a lapse of a small period of time from the start of lifting the substrate lifting pins 6, to a maximum of approximately 1.8 V. Thereafter, the pressure signal of the low differential pressure sensor PS gradually decreases.

On the other hand, when the substrate W is shifted from its normal position on the temperature control plate 2 as in the case of FIG. 4(*b*), the pressure signal of the small pressure difference PS increases, after a lapse of a small period of time from the start of lifting the substrate lifting pins 6, to a maximum of approximately 1.2 V. Thereafter, the pressure signal of the low differential pressure sensor PS gradually decreases.

In this manner, there is a great difference between the pressures in the branch pipe 5*b*, i.e., pressure fluctuations in the space K, when the substrate W is placed normally on the temperature control plate 2 and when the substrate W is shifted from its normal position on the temperature control plate 2.

The pressure fluctuation caused by lifting the substrate W in a shifted position on the temperature control plate 2 is much smaller than that when the substrate W is normally placed on the temperature control plate 2.

The low differential pressure sensor PS of FIGS. 1 to 3 supplies such a pressure signal to the substrate position detector 20.

This allows the substrate position detector 20 to generate the comparison detecting value signal as will now be explained. The comparison detecting value signal generated by the substrate position detector 20 is supplied to the bake unit controller 30, so that the bake unit controller 30 may determine the position of the substrate W on the temperature control plate 2 based on the comparison detecting value signal.

Figure 5:
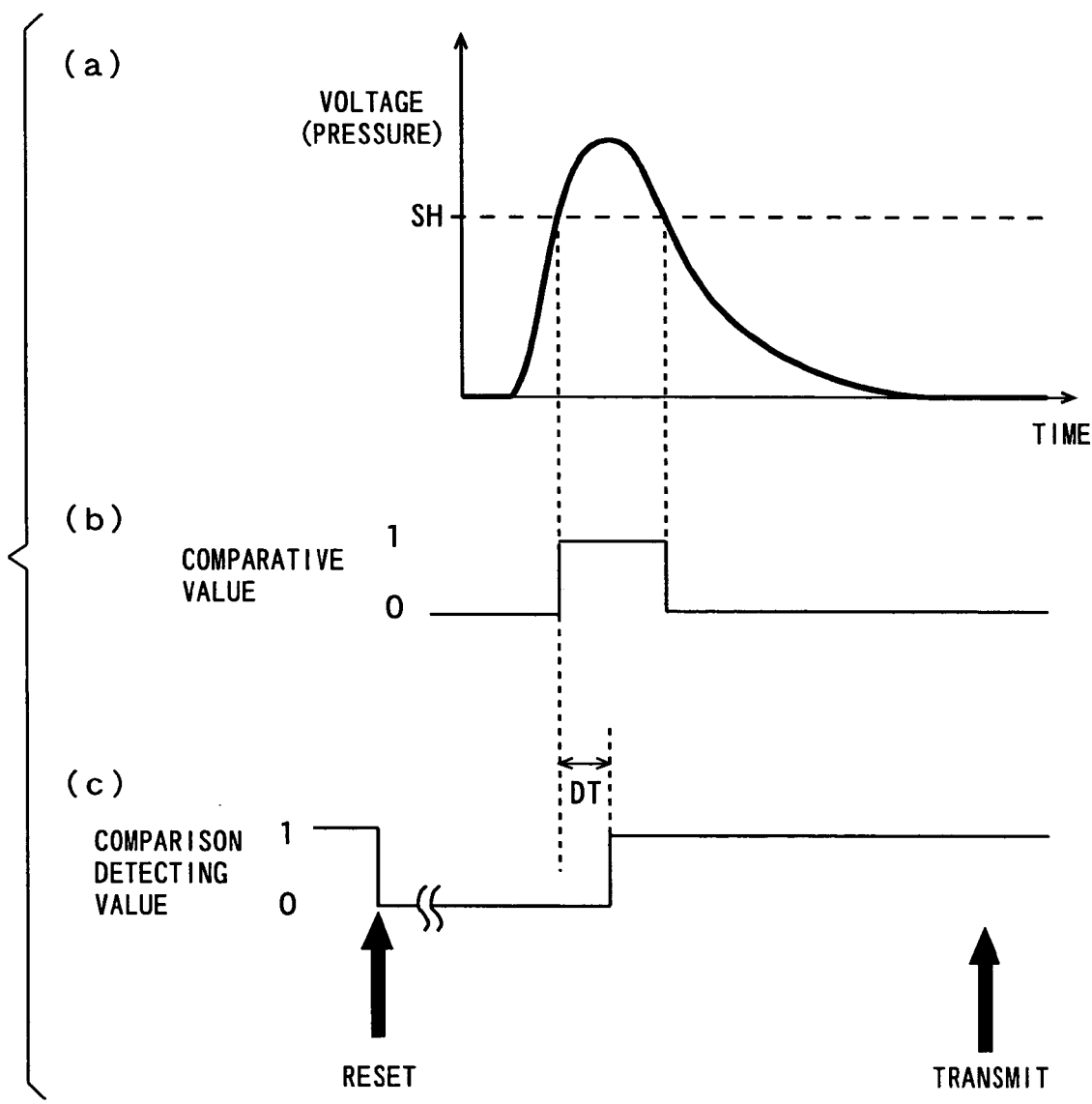
FIG. 5 is a diagram for use in illustrating the method for generating a comparison detecting value signal by the substrate position detector of FIG. 1.

FIG. 5 is a diagram for use in illustrating the method for generating the comparison detecting value signal by the substrate position detector 20 of FIG. 1.

Note that the substrate position detector 20 is supplied with the comparison detecting value reset signal in advance from the bake unit controller 30 along with various command parameters. The command parameters represent such parameters as a threshold value SH and delay time DT described below.

FIG. 5(a) shows a pressure value detecting waveform generated by the substrate position detector 20 based on the pressure signal from the low differential pressure sensor PS of FIG. 1. The ordinate shows voltage and the abscissa shows time. The voltage shown by the ordinate is proportional to the pressure in the branch pipe 5b of FIG. 1, i.e., the pressure in the pressure measuring pipe 5 of FIGS. 2 and 3.

In the first embodiment, the pressure signal supplied to the substrate position detector 20 from the low differential pressure sensor PS is an analog signal. Therefore, the substrate position detector 20 performs a moving average processing based on the pressure signal supplied from the low differential pressure sensor PS, thereby generating the pressure value detecting waveform.

The moving average processing involves buffering data input at a given timing a given number of times for averaging. This averages the noise accompanied with the analog signal, thus resulting in a smooth waveform as shown in FIG. 5(a).

Note that the given threshold value SH as indicated by the broken line is set for the substrate position detector 20 based on the command parameters from the bake unit controller 30.

As shown in FIG. 5(b), the substrate position detector 20 generates a comparison value of logic "1" for a pressure value detecting waveform equal to or higher than the threshold value SH, and a comparison value of logic "0" for a pressure value detecting waveform lower than the threshold value SH.

As a result, the comparison value indicates logic "1" with the substrate W being in its normal position, and indicates logic "0" with the substrate W being in an abnormal position (in a shifted position).

Note that the bake unit controller 30 has already been supplied with the up/down determination signal from the upper sensor 9A and lower sensor 9B, and therefore determines whether the substrate lifting pins 6 of FIG. 1 are lifted or lowered.

The substrate position detector 20 generates the comparison detecting value shown in FIG. 5(c), based on the delay time DT which is set in accordance with the generated comparison value and command parameters. The comparison detecting value consists of logics "1" and "0", similarly to the aforementioned comparison value.

The delay time DT is used to prevent the generation of an erroneous comparison value showing logic "1" due to chattering in the pressure value detecting waveform, for example. In other words, even if the pressure value detecting waveform becomes higher than the threshold value SH to cause the comparison value to be logic "1", the substrate position detector 20 would not generate the comparison detecting value of logic "1" unless the comparison value is continuously the same value (delay filter processing). The delay time DT is thus set longer than a chattering period of the pressure detecting waveform, so that the generation of an erroneous comparison value may be prevented.

In contrast, when the comparison value continuously shows logic "1" through the delay time DT, the substrate position detector 20 generates the comparison detecting value of logic "1".

The comparison detecting value signal is reset by the comparison detecting value reset signal supplied to the substrate position detector 20 from the bake unit controller 30 at a given timing, and turned to "0". At the same time, the comparison detecting value signal generated by the substrate position detector 20 is transmitted to the bake unit controller 30 at a given timing. Here, the given timing refers to the timing set in advance for the substrate position detector 20 in accordance with the aforementioned command parameters.

Description will be made of the operations of the substrate position detector 20 for detecting the position of the substrate, and the bake unit controller 30 based on the flowcharts of FIGS. 6 to 8.

Figure 6:
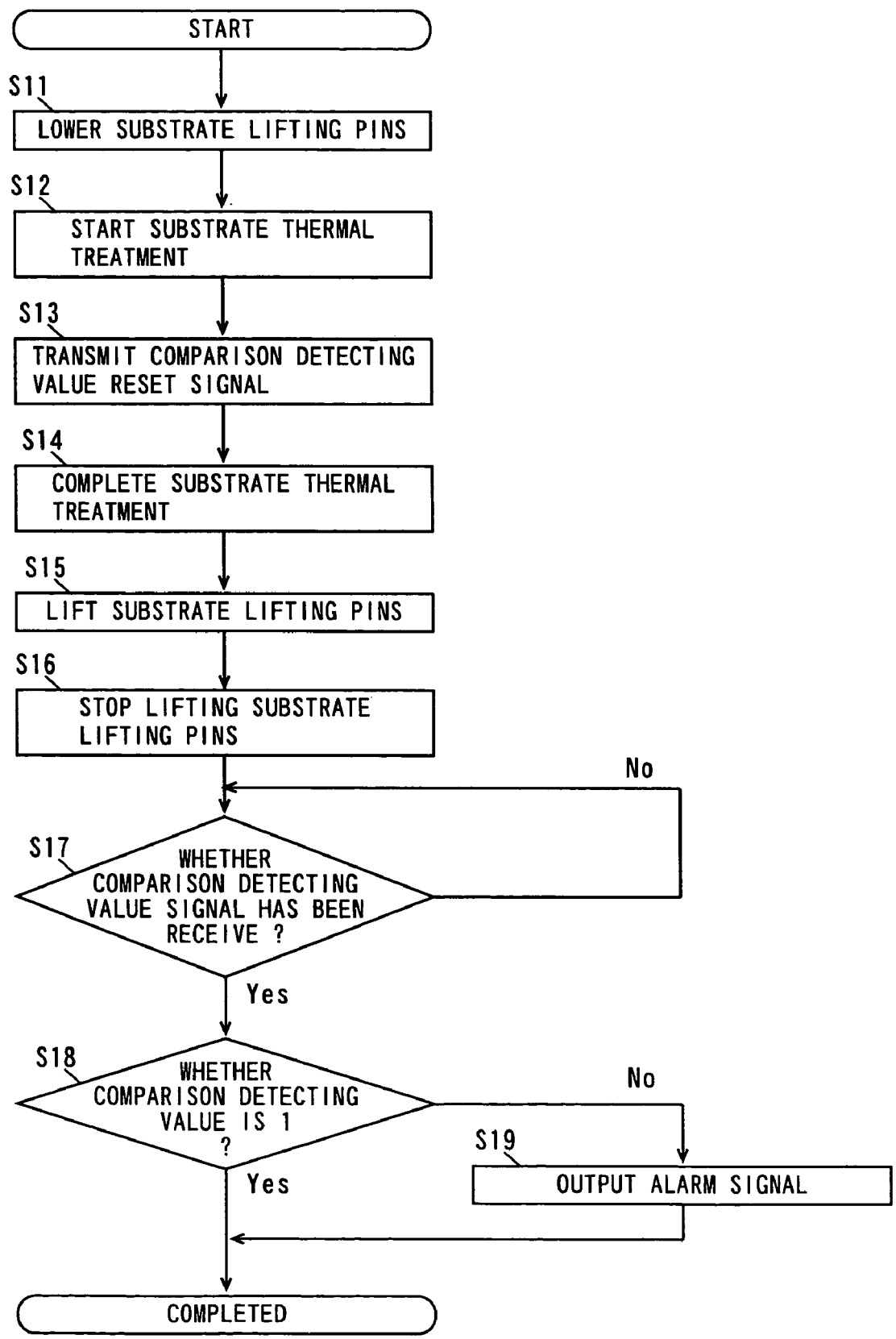
FIG. 6 is a flowchart showing the operation of a bake unit controller in detecting the position of the substrate when the substrate lifting pins of FIG. 1 are lifted.

FIG. 6 is a flowchart showing the operation of the bake unit controller 30 in detecting the position of the substrate W when the substrate lifting pins 6 of FIG. 1 are lifted.

In the following description, the bake unit controller 30 is capable of controlling the operations of the temperature control plate 2 and lifting device 8.

The bake unit controller 30 initially supplies the lifting device 8 with a signal for lowering the substrate lifting pins 6 supporting the substrate W. This lowers the substrate lifting pins 6 to place the substrate W onto the temperature control plate 2 (Step S11).

The bake unit controller 30 subsequently supplies the temperature control plate 2 with a signal for starting thermal treatment of the substrate W. This allows the temperature control plate 2 to start thermally treating the substrate W (Step S12).

Then, the bake unit controller 30 transmits the comparison detecting value reset signal to the substrate position detector 20 (Step S13). Here, the bake unit controller 30 may supply the substrate position detector 20 with the aforementioned command parameters along with the comparison detecting value reset signal.

The bake unit controller 30 then supplies the temperature control plate 2 with a signal for stopping the thermal treatment of the substrate W. The thermal treatment of the substrate W by the temperature control plate 2 is thus completed (Step S14).

The bake unit controller 30 supplies the lifting device 8 with a signal for lifting the substrate lifting pins 6. This allows the substrate lifting pins 6 to be lifted and support the substrate W (Step S15). The substrate W is thus lifted.

After lifting the substrate lifting pins 6 to a given height, the bake unit controller 30 supplies the lifting device 8 with a signal to stop lifting the substrate lifting pins 6. The substrate lifting pins 6 thus stop being lifted (Step S16). This results in the substrate W being supported at the given height.

Here, the bake unit controller 30 determines whether or not the comparison detecting value signal has been received from the substrate position detector 20 (Step S17).

When receiving the comparison detecting value signal from the substrate position detector 20, the bake unit controller 30 determines whether or not the signal is logic "1" (if the substrate W is in its normal position) (Step S18).

When the received comparison detecting value signal is logic "1", the bake unit controller 30 determines that the substrate W is in its normal position, thus completing detection of the position of the substrate W.

On the other hand, when the received comparison detecting value signal is logic "0", the bake unit controller 30 determines that the substrate W is in an abnormal position, thus supplying an alarm signal to the host controller or alarm device (not shown) (Step S19).

The substrate position detector 20 operates in response to the above operation of the bake unit controller 30 in a following manner.

Figure 7:
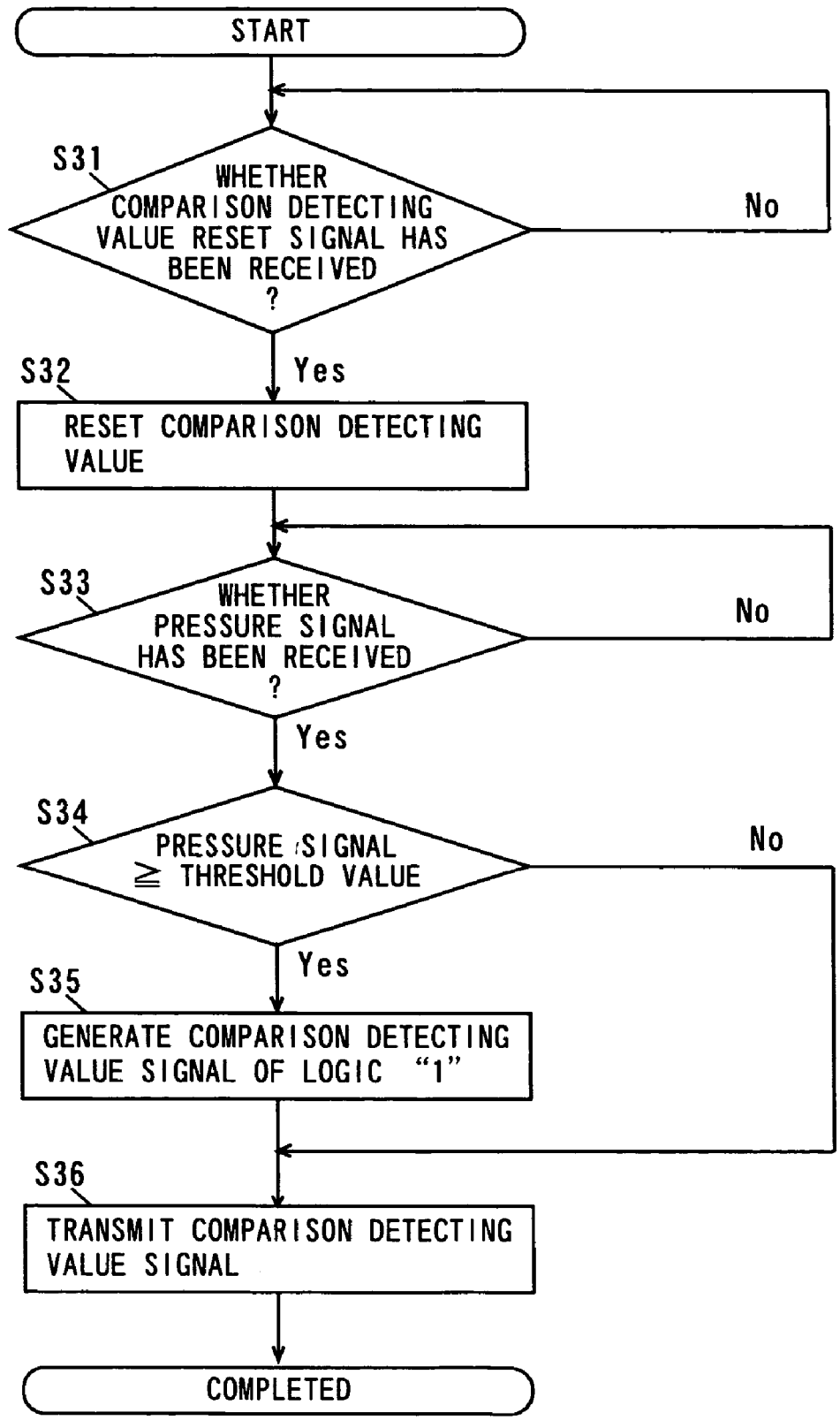
FIG. 7 is a flowchart showing the operation of the substrate position detector in detecting the position of the substrate when the substrate lifting pins of FIG. 1 are lifted.

FIG. 7 is a flowchart showing the operation of the substrate position detector 20 in detecting the position of the substrate W when the substrate lifting pins 6 of FIG. 1 are lifted.

Initially, the substrate position detector 20 determines whether or not the comparison detecting value reset signal has been received from the bake unit controller 30 (Step S31).

When receiving the comparison detecting value reset signal, the substrate position detector 20 resets its comparison detecting value (Step S32). Note that the command parameters, along with the comparison detecting value reset signal, are already received from the bake unit controller 30 at Step S31 above.

The substrate position detector 20 subsequently determines whether the pressure signal has been received from the low differential pressure sensor PS of FIG. 1 (Step S33).

When receiving the pressure signal from the low differential pressure sensor PS, the substrate position detector 20 compares the input pressure signal with a threshold value obtained from the command parameters to determine whether the pressure signal is equal to or higher than the threshold value (Step S34).

When the pressure signal is equal to or higher than the threshold value, the substrate position detector 20 generates a comparison detecting value of logic "1" (Step S35). Then, it transmits the generated comparison detecting value to the bake unit controller 30 (Step S36).

When the pressure signal is lower than the threshold value at Step S34 above, the substrate position detector 20 transmits a comparison detecting value of logic "0" to the bake unit controller 30 (Step S36).

The substrate position detector 20 thus completes detection of the position of the substrate W.

The bake unit controller 30 may detect the position of the substrate W when the substrate lifting pins 6 are lowered. In this case, the bake unit controller 30 operates as follows.

Figure 8:
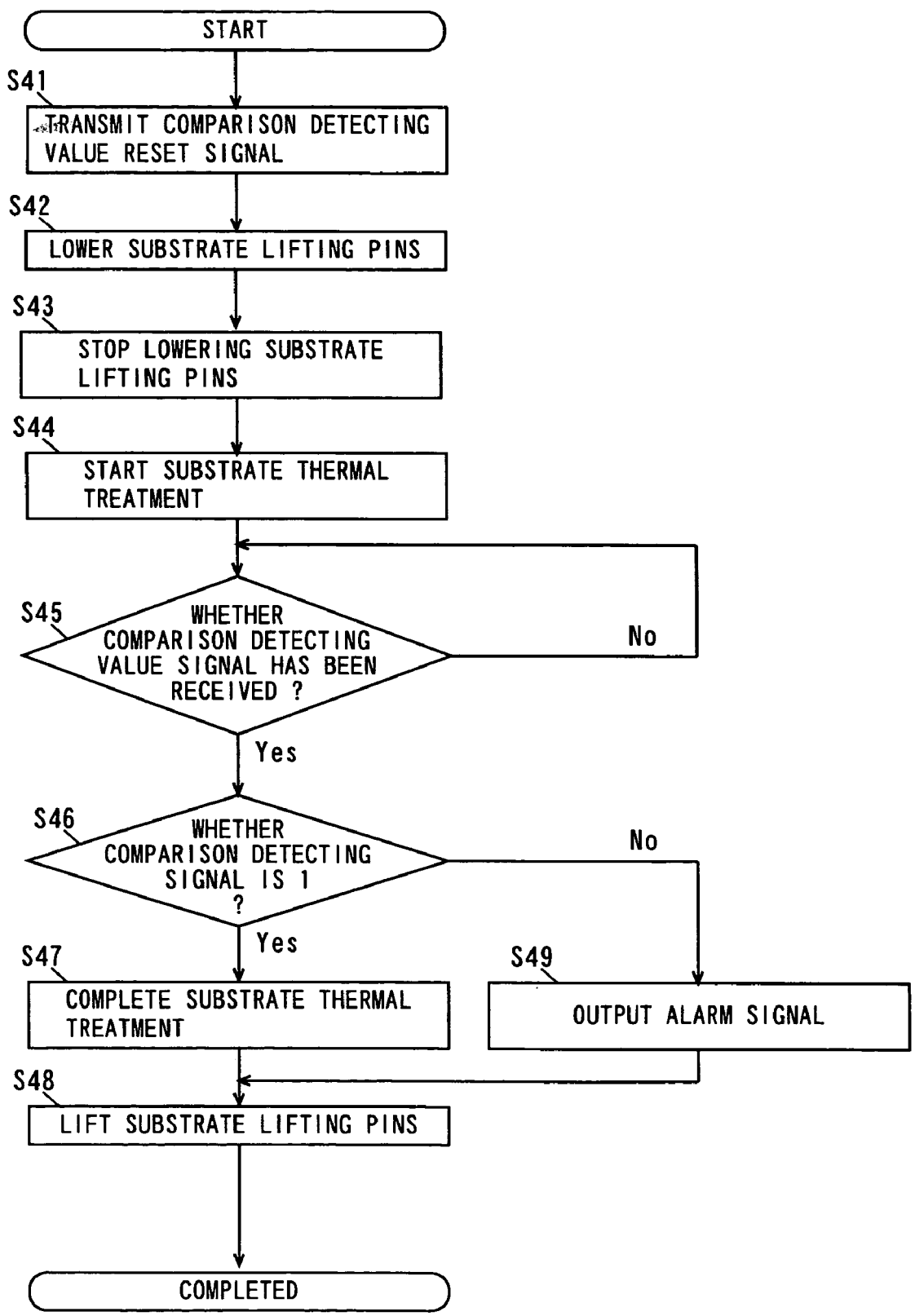
FIG. 8 is a flowchart showing the operation of the bake unit controller in detecting the position of the substrate when the substrate lifting pins of FIG. 1 are lowered.

FIG. 8 is a flowchart showing the operation of the bake unit controller 30 in detecting the position of the substrate W when the substrate lifting pins 6 of FIG. 1 are lowered.

In the following description, the bake unit controller 30 is capable of controlling the operations of the temperature control plate 2 and lifting device 8.

Initially, the bake unit controller 30 transmits the comparison detecting value reset signal to the substrate position detector 20 (Step S41). The bake unit controller 30 may supply the substrate position detector 20 with the aforementioned command parameters along with the comparison detecting value reset signal, as described above.

Then, the bake unit controller 30 supplies the lifting device 8 with a signal for lowering the substrate lifting pins 6 supporting the substrate W. The substrate lifting pins 6 are thus lowered (Step S42).

After lowering the substrate lifting pins 6 to a given height, the bake unit controller 30 supplies the lifting device 8 with a signal for stopping the substrate lifting pins 6 from being lowered. The substrate lifting pins 6 thus stop being lowered (Step S43). This results in the substrate W being placed onto the temperature control plate 2.

The bake unit controller 30 subsequently supplies the temperature control plate 2 with a signal for starting thermal treatment of the substrate W. The temperature control plate 2 thus starts thermally treating the substrate W (Step S44).

Here, the bake unit controller 30 determines whether or not the comparison detecting value signal has been received from the substrate position detector 20 (Step S45).

When receiving the comparison detecting value signal from the substrate position detector 20, the bake unit controller 30 determines whether or not the received comparison detecting value signal is logic "1" (if the substrate W is in its normal position) (Step S46).

When the received comparison detecting value signal is logic "1", the bake unit controller 30 determines that the substrate W is in its normal position, thus supplying the temperature control plate 2 with a signal for stopping the thermal treatment of the substrate W. The temperature control plate 2 thus completes the thermal treatment of the substrate W (Step S47).

The bake unit controller 30 then supplies the lifting device 8 with a signal for lifting the substrate lifting pins 6. This allows the substrate lifting pins 6 to be lifted and support the substrate W (Step S48). The substrate W is thus lifted, and the bake unit controller 30 completes detection of the position of the substrate W.

On the other hand, when the received comparison detecting value signal is logic "0", the bake unit controller 30 determines that the substrate W is in an abnormal position, thus supplying an alarm signal to the host controller or alarm device (not shown) (Step S49). It subsequently performs the operation of Step S48 above.

During this detection when the substrate lifting pins 6 are lowered, the substrate position detector 20 of FIG. 1 operates similarly to the flowchart of FIG. 7.

As described above, with the thermal processing unit 1, substrate position detector 20, and bake unit controller 30 according to the first embodiment, the substrate W is lifted or lowered above the temperature control plate 2 by the substrate lifting pins 6. Then, the pressure measuring pipe 5 and low differential pressure sensor PS detect a variation in the airflow that occurs in the space between the substrate W and temperature control plate 2, when the substrate W is lifted or lowered by the substrate lifting pins 6, i.e., a variation in the pressure. Consequently, based on the detected variation in the pressure, the substrate position detector 20 and bake unit controller 30 determine the position of the substrate W on the temperature control plate 2.

Since the position of the substrate W can thus be determined based on the variation in the pressure caused by lifting or lowering the substrate W, a shifted position of the substrate W can be detected with a simple structure.

In the example of the thermal processing unit 1 of FIG. 1, the low differential pressure sensor PS is connected to the branch pipe 5b of the pressure measuring pipe 5 to detect a variation in the pressure caused by lifting or lowering the substrate W; however, a flow rate sensor may be connected to the branch pipe 5b in place of the low differential pressure sensor PS. In this case, the flow rate sensor detects a variation in the flow rate of fluid flowing in the branch pipe 5b based on the pressure caused by lifting or lowering the substrate W. The position of the substrate W is then determined based on the variation in the flow rate detected by the flow rate sensor.

In addition, a variation in the airflow through the pin inserting hole 2H of the temperature control plate 2, i.e., a variation in the pressure therein is detected by the flow rate sensor FL. This makes it possible to detect a shifted position of the substrate W with a simple structure without the provision of additional gas path.

In the first embodiment, the low differential pressure sensor PS or flow rate sensor detects a pressure or flow rate, the substrate position detector 20 processes the signal detected by the low differential pressure sensor PS or flow rate sensor, the bake unit controller 30 controls the operation of lifting and lowering by the substrate lifting pins 6, coupling member 7, and lifting device 8, and the position of the substrate W on the temperature control plate 2 is determined based on the processing result from the substrate position detector 20.

The separate provision of the substrate position detector 20 and bake unit controller 30 makes it possible to detect the position of the substrate W without increasing the burden of the bake unit controller 30.

The substrate position detector 20 compares the output from the low differential pressure sensor PS or flow rate sensor with the prescribed threshold value for output of the comparison detecting value signal. Moreover, the bake unit controller 30 determines the position of the substrate W on the temperature control plate 2 based on the comparison detecting value signal. This makes it possible to detect a shifted position of the substrate W with a simple structure.

Prior to lifting or lowering the plurality of substrate lifting pins 6, the bake unit controller 30 makes the comparison detecting value signal from the substrate position detector 20 reset to a given state using the comparison detecting value reset signal, and after lifting or lowering the plurality of substrate lifting pins 6, receives another comparison detecting value signal from the substrate position detector 20. Thus, the comparison detecting value signal can be easily obtained. Note that the comparison detecting value signal is held in the substrate position detector 20 until it is subsequently reset.

The thermal processing unit 1 according to the first embodiment may alternatively have a structure that follows without using the pressure measuring pipe 5 and low differential pressure sensor PS of FIG. 1.

Figure 9:
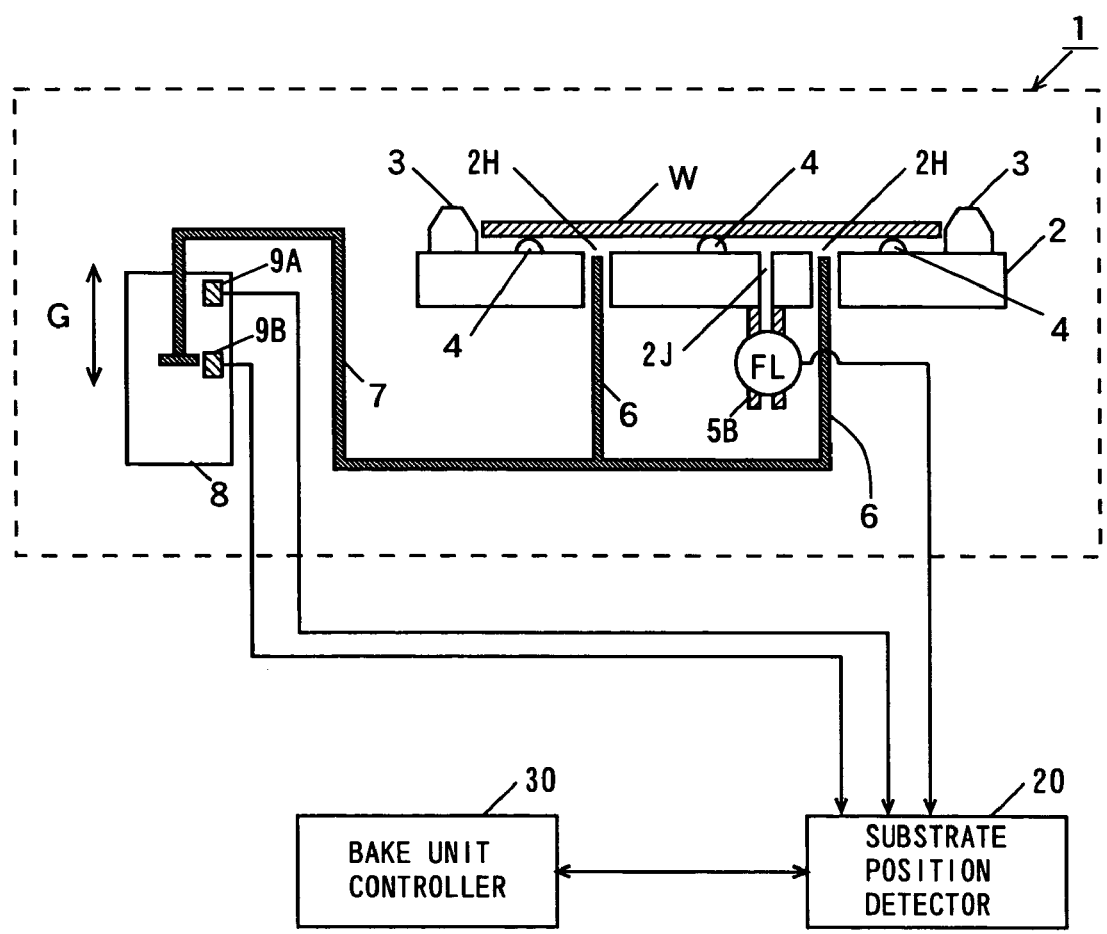
FIG. 9 is a diagram showing an example of the structure using the flow rate sensor in the thermal processing unit of FIG. 1.

FIG. 9 is a diagram showing an example of the structure using the flow rate sensor in the thermal processing unit 1 of FIG. 1. The thermal processing unit 1 of FIG. 9 differs from the thermal processing unit 1 of FIG. 1 as follows.

In the thermal processing unit 1 of FIG. 9, a fluid inserting hole 2J is provided in a given position of the temperature control plate 2.

Also, a flow rate measuring pipe 5B is provided at a lower end of the fluid inserting hole 2J. The flow rate measuring pipe 5B is formed in a given length to be coaxial with the fluid inserting hole 2J while maintaining the inside diameter of the fluid inserting hole 2J. The flow rate measuring pipe 5B is provided with a flow rate sensor FL. The flow rate sensor FL detects the flow rate of fluid exhausted from the space surrounded by the substrate W and an upper face of the temperature control plate 2 through the fluid inserting hole 2J and flow rate measuring pipe 5B.

In this case, it is possible to determine the position of the substrate W based on a variation in the airflow in the space between the substrate W and temperature control plate 2 that occurs when the substrate W is lifted or lowered, i.e., a variation in the flow rate detected by the flow rate sensor FL, thereby detecting a shifted position of the substrate W with a simple structure.

Moreover, a variation in the airflow through the fluid inserting hole 2J of the temperature control plate 2, i.e., a variation in the flow rate is detected by the flow rate sensor FL. This makes it possible to detect a shifted position of the substrate W with a simple structure.

As in the above described case of FIG. 1, prior to lifting or lowering the plurality of substrate lifting pins 6, the bake unit controller 30 makes the comparison detecting value signal from the substrate position detector 20 reset to a given state using the comparison detecting value reset signal, and after lifting or lowering the plurality of substrate lifting pins 6, receives another comparison detecting value signal from the substrate position detector 20. Thus, the comparison detecting value signal can be easily obtained. Note that the comparison detecting value signal is held in the substrate position detector 20 until it is subsequently reset.

Figure 10:
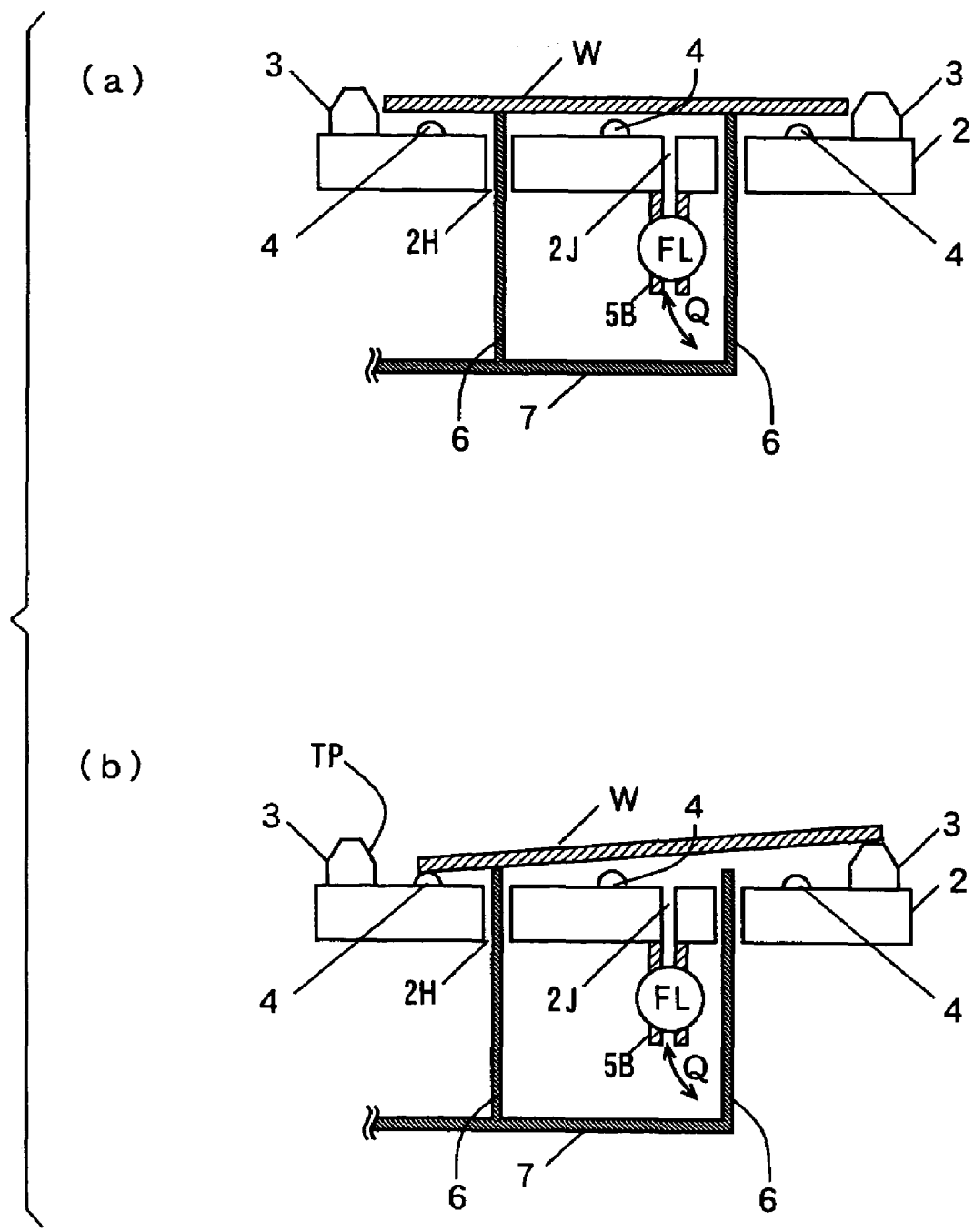
FIG. 10(a) shows the flow of fluid with the substrate being in its normal position on the temperature control plate.
FIG. 10(b) shows the flow of fluid with the substrate being in a shifted position on the temperature control plate.

FIG. 10(*a*) shows the flow of fluid with the substrate W being in its normal position on the temperature control plate 2, and FIG. 10(*b*) shows the flow of fluid with the substrate W being in a shifted position on the temperature control plate 2.

As shown in FIG. 10(*a*), (*b*), when the substrate W is lifted or lowered above the temperature control plate 2 by the substrate lifting pins 6, a pressure fluctuation in the space formed between the substrate W and upper face of the temperature control plate 2 induces a flow of fluid at the end of the flow rate measuring pipe 5B in the direction of arrow Q.

The flow of fluid varies depending on the pressure fluctuation in the aforementioned space. For example, the speed of the fluid increases with a greater pressure fluctuation. In contrast, the speed decreases with a smaller pressure fluctuation.

In this case, the pressure fluctuation becomes greater when the substrate W is in its normal position on the temperature control plate 2, as shown in FIG. 4 above. As a result, the flow rate sensor FL of FIG. 10(*a*) detects a high flow rate. In contrast, the pressure fluctuation becomes smaller when the substrate W is in a shifted position on the temperature control plate 2. As a result, the flow rate sensor FL of FIG. 10(*a*) detects a low flow rate.

Therefore, the position of the substrate W can be detected in the thermal processing unit 1 of FIG. 10 by applying the flow rate detected by the flow rate sensor FL to the aforementioned pressure signal.

In the example of the thermal processing unit 1 of FIG. 9, the flow rate measuring pipe 5B provided with the flow rate sensor FL is connected to the fluid inserting hole 2J; however, the pressure measuring pipe of FIG. 1 with the low differential pressure sensor PS may alternatively be connected to the fluid inserting hole 2J. In this case, the position of the substrate W is detected based on a variation in the pressure caused by lifting or lowering the substrate W, as described above.

Description will, hereinafter, be made of a substrate processing apparatus using the thermal processing unit 1, substrate position detector 20, and bake unit controller 30 according to the first embodiment.

Figure 11:
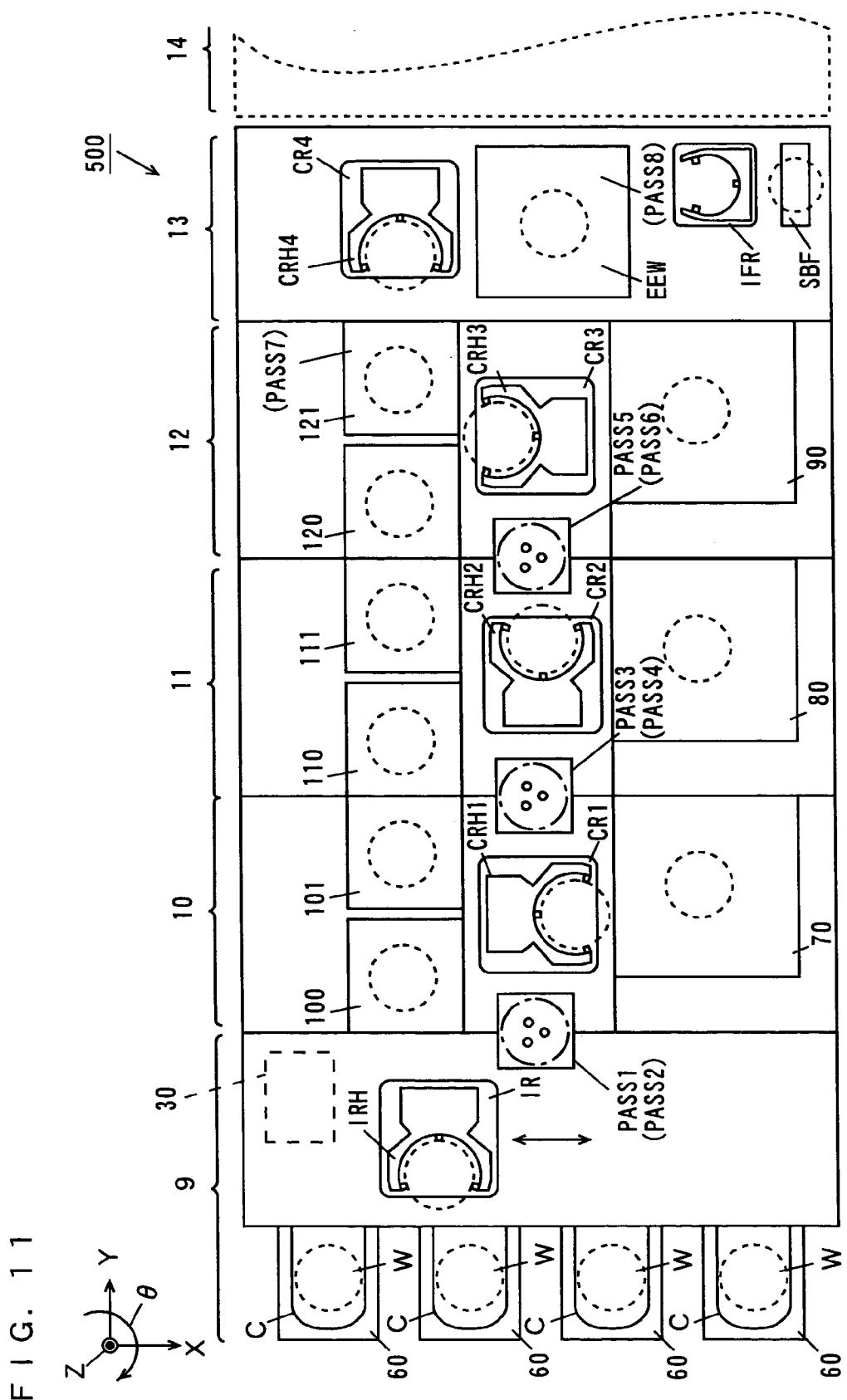
FIG. 11 is a plan view of a substrate processing apparatus using the thermal processing unit, substrate position detector, and bake unit controller according to the first embodiment.

FIG. 11 is a plan view of the substrate processing apparatus using the thermal processing unit 1, substrate position detector 20, and bake unit controller 30 according to the first embodiment.

Figure 12:
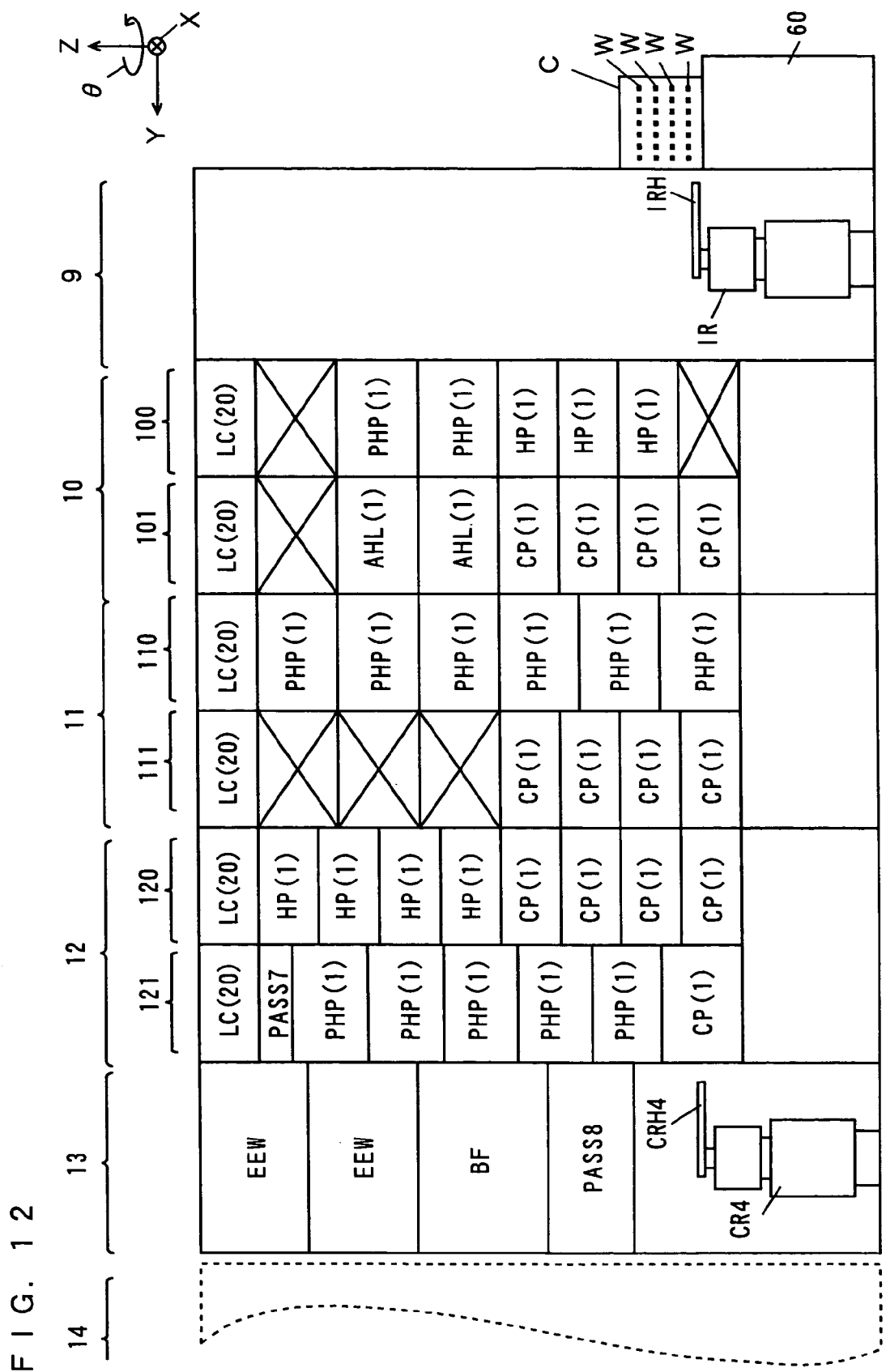
FIG. 12 is a side view of the substrate processing apparatus of FIG. 11 taken from the −X direction.
Figure 13:
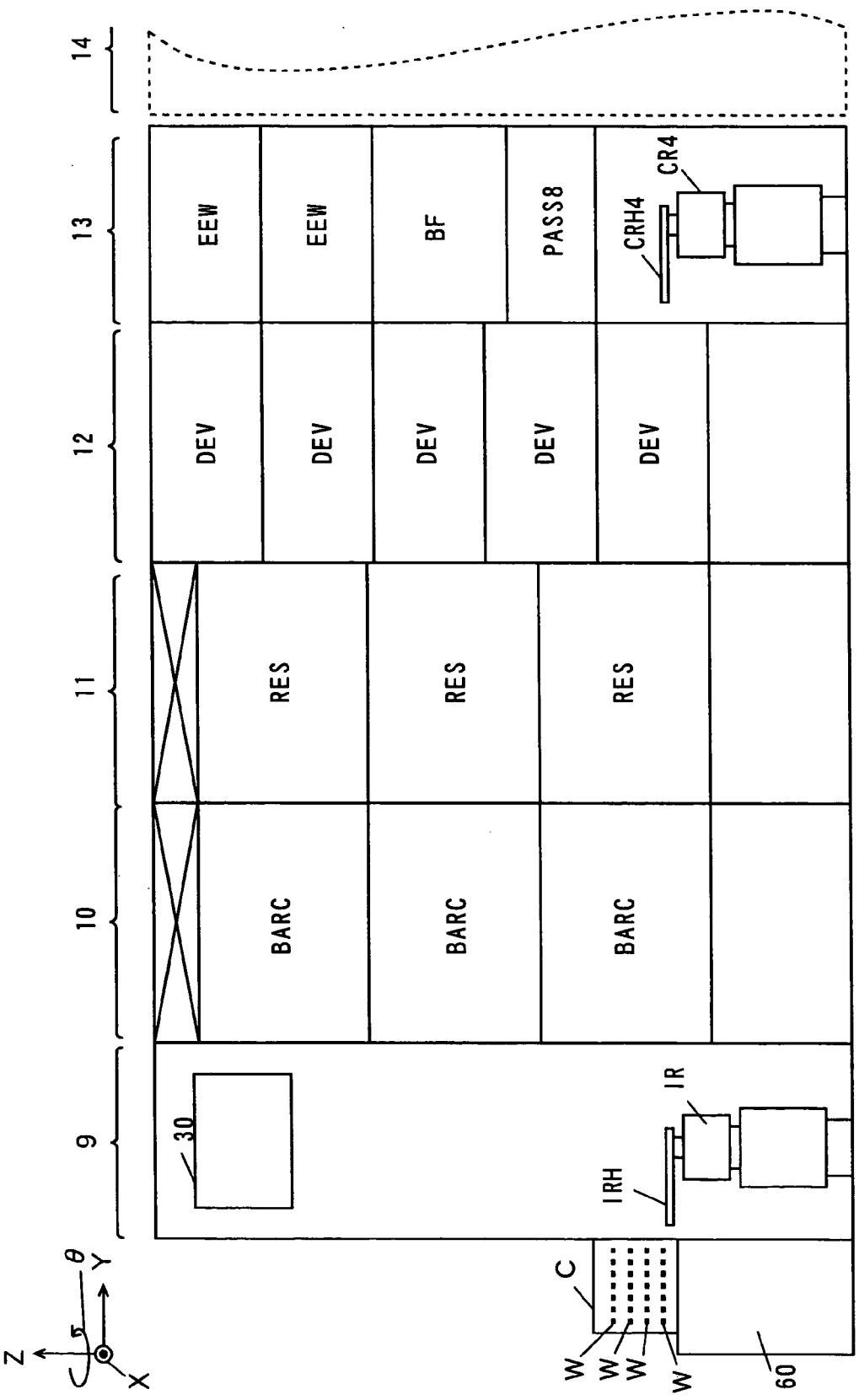
FIG. 13 is a side view of the substrate processing apparatus of FIG. 11 taken from the +X direction.

Each of FIG. 11 and following FIGS. 12 to 13 is indicated by the arrows showing an X direction, Y direction, and X direction perpendicular with one another for clarity of positions. The X and Y directions are perpendicular with each other in the horizontal plane, with the Z direction corresponding to the vertical direction. Note that the direction toward each arrow is defined as a + direction, and the opposite direction as a − direction. The rotation direction around the Z direction is defined as a θ direction.

As shown in FIG. 11, the substrate processing apparatus 500 includes an indexer block 9, an anti-reflection film processing block 10, a resist film processing block 11, a developing block 12, and interface block 13. A stepper unit 14 is arranged to adjoin the interface block 13.

The indexer block 9 includes a plurality of carrier mounting bases 60 and an indexer robot IR. The indexer robot IR has a hand IRH for receiving/transferring the substrate W. The indexer robot is also provided with the bake unit controller 30 of FIG. 1 which detects the position of the substrate W while controlling the operation of thermal processing units described later. The anti-reflection film processing block 10 includes thermal processors 100, 101 for anti-reflection film, an anti-reflection film coater 70, and a first center robot CR1. The anti-reflection film coater 70 is provided opposite to the thermal processors 100, 101 for anti-reflection film with the first center robot CR1 therebetween. The first center robot CR1 has a hand CRH1 for receiving/transferring the substrate W.

The resist film processing block 11 includes thermal processors 110, 111 for resist film, a resist film coater 80, and a second center robot CR2. The resist film coater 80 is provided opposite to the thermal processors 110, 111 for resist film with the second center robot CR2 therebetween. The second center robot CR2 has a hand CRH2 for receiving/transferring the substrate W.

The developing block 12 includes thermal processors 120, 121 for development, a developer 90, and a third center robot CR3. The developer 90 is provided opposite to the thermal processors 120, 121 for development with the third center robot CR3 therebetween. The third center robot CR3 has a hand CRH3 for receiving/transferring the substrate W.

The interface block 13 includes a fourth center robot CR4, a buffer BF, a transport mechanism IFR for interface, and an edge exposure unit EEW. The fourth center robot CR4 has a hand CRH4 for receiving/transferring the substrate W. The transport mechanism IFR for interface receives/transfers the substrate W between a substrate PASS8 described later and the stepper unit 14.

In the substrate processing apparatus 500 according to the first embodiment, the indexer block 9, anti-reflection film processing block 1, resist film processing block 11, developing block 12, and interface block 13 are arranged in this order along the Y direction.

Each of the indexer block 9, anti-reflection film processing block 10, resist film processing block 11, developing block 12, and interface block 13 will, hereinafter, be called a processing block.

The substrate processing apparatus 500 is provided with a main controller (not shown) which controls the operation of each of the processing blocks.

Partition walls are also provided between adjoining processing blocks. Each of the partition walls has two of substrate mounting units PASS1 to PASS6 provided vertically close to each other for receiving/transferring the substrate W from one processing block to another.

The thermal processor 121 for development in the developing block 12 is provided with the substrate mounting unit PASS7, and the edge exposure unit EEW in the interface block 13 is provided with the substrate mounting unit PASS 8, as will be described later. The substrate mounting units PASS1 to PASS8 are each provided with a plurality of support pins fixed thereon. Additionally, the substrate mounting units PASS1 to PASS8 are each provided with an optical sensor (not shown) which detects the presence/absence of the substrate W. This makes it possible to determine whether or not the substrate W is placed on any of the substrate mounting units PASS1 to PASS8.

The substrate mounting units PASS1, PASS3, PASS5 are used for receiving/transferring an unprocessed substrate W, while the substrate mounting units PASS2, PASS4, PASS6 are used for receiving/transferring a processed substrate W.

Now, the operation of the substrate processing apparatus 500 according to the first embodiment will be described briefly.

A carrier C which houses a plurality of substrates W in multiple stages is installed on each of the carrier mounting bases 60 in the indexer block 9. The indexer robot IR takes out an unprocessed substrate W housed inside a carrier C using the hand IRH for receiving/transferring the substrate W. The indexer robot IR subsequently rotates in the ± θ direction while moving in the ± X direction to transfer the unprocessed substrate W onto the substrate mounting unit PASS1.

FOUPs (Front Opening Unified Pods) are adopted as the carriers C according to the first embodiment; however, SMIF (Standard Mechanical Interface) pods or OCs (Open Cassettes) which expose the housed substrates W to outside air may, for example, be used without limited to the one mentioned herein. Moreover, linear motion type transport robots which advance/withdraw their hands by sliding them linearly with respect to the substrate W are used for the indexer robot IR, first to fourth center robots CR1 to CR4, and interface transport mechanism IFR, respectively; however, multi-joint type transport robots which advance/withdraw their hands linearly by moving their joints may also be used without limited to the one mentioned herein.

The unprocessed substrate W transferred on the substrate mounting unit PASS1 is received by the hand CRH of the first center robot CR1 in the anti-reflection film processing block 10. The first center robot CR1 carries the substrate W into the anti-reflection film coater 70. In the anti-reflection film coater 70, in order to decrease a standing wave or halation generated during exposure, an anti-reflection film is formed under a photoresist film by a coating unit BARC described later Then, the first center robot CR1 takes out the substrate W from the anti-reflection film coater 70 to carry it into the thermal processors 100, 101 for anti-reflection film. After the substrate W has undergone a given processing in the thermal processors 100, 101 for anti-reflection film, the first center robot CR1 takes out the substrate W from there to transfer it onto the substrate mounting unit PASS3.

The substrate W transferred on the substrate mounting unit PASS3 is received by the hand CRH2 of the second center robot CR2. The second center robot CR2 carries the substrate W into the resist film coater 80. In the resist film coater 80, a photoresist film is formed on the substrate W having the anti-reflection film coated thereon by a coating unit RES described later. The second center robot CR2 subsequently takes out the substrate W from the resist film coater 80 to carry it into the thermal processors 110, 111 for resist film. After the substrate W has undergone a given processing in the thermal processors 110, 111 for resist film, the second center robot CR2 takes out the substrate W from there to transfer it onto the substrate mounting unit PASS5.

The substrate W transferred on the substrate mounting unit PASS5 is received by the hand CRH3 of the third center robot CR3 in the developing block 12. The third center robot CR3 transfers the substrate W onto the substrate mounting unit PASS7. The substrate W transferred on the substrate mounting unit PASS7 is received by the hand CRH4 of the fourth center robot CR4 in the interface block 13. The fourth center robot CR4 carries the substrate W into the edge exposure unit EEW. After the substrate W has undergone a given processing in the edge exposure unit EEW, the fourth center robot CR4 takes out the substrate W from there to transfer it onto the substrate mounting unit PASS8 provided in the edge exposure unit EEW.

The substrate W transferred on the substrate mounting unit PASS8 is received by the transport mechanism IFR for interface. The interface transport mechanism IFR carries the substrate W into the stepper unit 14, where the substrate W undergoes a given processing. Then, the interface transport mechanism IFR receives the substrate W from the stepper unit 14 to transfer it onto the substrate mounting unit PASS8 provided in the edge exposure unit EEW.

The substrate W transferred on the substrate mounting unit PASS8 is received by the hand CRH4 of the fourth center robot CR4 in the interface block 13. The fourth center robot CR4 carries the substrate W into the thermal processor 121 for development, where the substrate W is thermally treated. The fourth center robot CR4 subsequently takes-out the substrate W from the thermal processor 121 for development, and transfers it onto the substrate mounting unit PASS7.

The substrate W transferred on the substrate mounting unit PASS7 is received by the hand CRH3 of the third center robot in the developing block 12. The third center robot CR3 carries the substrate W into the developer 90, where the exposed substrate W undergoes development. Then, the third center robot CR3 takes out the substrate W from the developer 90 to carry it into the thermal processor 120 for development. After the substrate W has undergone a given processing in the thermal processor 120 for development, the third center robot CR3 takes out the substrate W from there to transfer it onto the substrate mounting unit PASS6 provided in the resist film processing block 11.

The substrate W transferred on the substrate mounting unit PASS6 is transferred onto the substrate mounting unit PASS4 by the second center robot CR2 in the resist film processing block 11. The substrate W transferred on the substrate mounting unit PASS4 is transferred onto the substrate mounting unit PASS2 by the first center robot CR1 in the anti-reflection film processing block 10.

The substrate W transferred on the substrate mounting unit PASS2 is housed inside a carrier C by the indexer robot IR in the indexer block 9.

Now refer to FIG. 12, which is a side view of the substrate processing apparatus 500 of FIG. 11 taken from the − X direction.

A carrier C housing substrates W is mounted on the carrier mounting base 60 in the indexer block 9. The hand IRH of the indexer robot IR rotates in the ± θ direction or advances/withdraws in the ± Y direction to receive/transfer a substrate W in the carrier C.

As for the anti-reflection film processing block 10, two thermal processing units PHP with transfer portions (hereinafter simply called thermal processing units) and three hotplates HP are vertically stacked in the thermal processor 100 for anti-reflection film, and two adhesion agent coaters AHL and four cooling plates CP are vertically stacked in the thermal processor 101 for anti-reflection film. Local controllers LC for controlling the temperatures of the thermal processing units PHP, hotplates HP, adhesion agent coaters AHL, and cooling plates CP are also arranged in the uppermost parts of the anti-reflection film thermal processors 100, 101, respectively.

Note that the thermal processing units PHP, hotplates HP, adhesion agent coaters AHL, and cooling plates CP each have the structure of the thermal processing unit 1 of FIG. 1 above. The local controllers LC each have the structure and operation of the substrate position detector 20 of FIG. 1 above.

The position of the substrate W during operation of each of the thermal processing unit PHP, hotplate HP, adhesion agent coater AHL, and cooling plate CP can thus be detected.

As for the resist film processing block 11, six thermal processing units PHP are vertically stacked in the thermal processor 110 for resist film, and four cleaning plates CP are vertically stacked in the thermal processor 111 for resist film. Local controllers LC for controlling the temperatures of the thermal processing units PHP and cooling plates CP are also arranged in the uppermost parts of the thermal processors 110, 111 for resist film, respectively.

Note that the thermal processing units PHP and cooling plates CP each have the structure of the thermal processing unit 1 of FIG. 1 above. The local controllers LC each have the structure and operation of the substrate position detector 20 of FIG. 1 above.

The position of the substrate W during operation of each of the thermal processing units PHP and cooling plates CP can thus be detected.

As for the developing block 12, four hotplates HP and four cooling plates CP are vertically stacked in the thermal processor 120 for development, and the substrate mounting unit PASS7, five thermal processing units PHP, and a cooling plate CP are vertically stacked in the thermal processor 121 for development. Local controllers LC for controlling the temperatures of the thermal processing units HP, hotplates HP, and cooling plate CP are also arranged in the uppermost parts of the thermal processors 120, 121 for development, respectively.

Note that the thermal processing units PHP, hotplates HP, and cooling plates CP each have the structure of the thermal processing unit 1 of FIG. 1 above. The local controllers LC each have the structure and operation of the substrate position detector 20 of FIG. 1 above.

The position of the substrate W during operation of each of the thermal processing units PHP, hotplates HP, and cooling plates CP can thus be detected.

Two edge exposure units EEW, a buffer unit BF, and the substrate mounting unit PASS8 are vertically stacked in the interface block 13 with the fourth center robot CR4 and interface transport mechanism IFR (not shown) being arranged.

FIG. 13 is a side view of the substrate processing apparatus 500 of FIG. 11 taken from the + X direction.

The bake unit controller 30 of FIG. 1 is arranged at an upper part of the indexer block 9. Three coating units BARC are vertically stacked in the anti-reflection film coater 70. Three coating units RES are vertically stacked in the resist film coater 80. Five developers DEVs are vertically stacked in the developer 90.

In the substrate processing apparatus 500 of FIG. 11 above, the thermal processing units PHP, hotplates HP, adhesion agent coaters AHL, and cooling plats CP with the structure of the thermal processing unit 1 are provided. Additionally, the local controllers LC are provided which have the operation and structure of the substrate position detector 20 for detecting the position of the substrate W during operation of each of the thermal processing units PHP, hotplates HP, adhesion agent coaters AHL, and cooling plates CP. The bake unit controller 30 of FIG. 1 is further provided.

The position of the substrate W can thus be detected during each of the various processings of the substrate in the thermal processing units PHP, hotplates HP, adhesion agent coaters AHL, and cooling plates CP.

(Second Embodiment)

A substrate processing unit according to a second embodiment differs from the substrate processing unit according to the first embodiment as follows.

In the second embodiment also, a thermal processing unit for thermally treating a substrate will be taken as an example.

Figure 14:
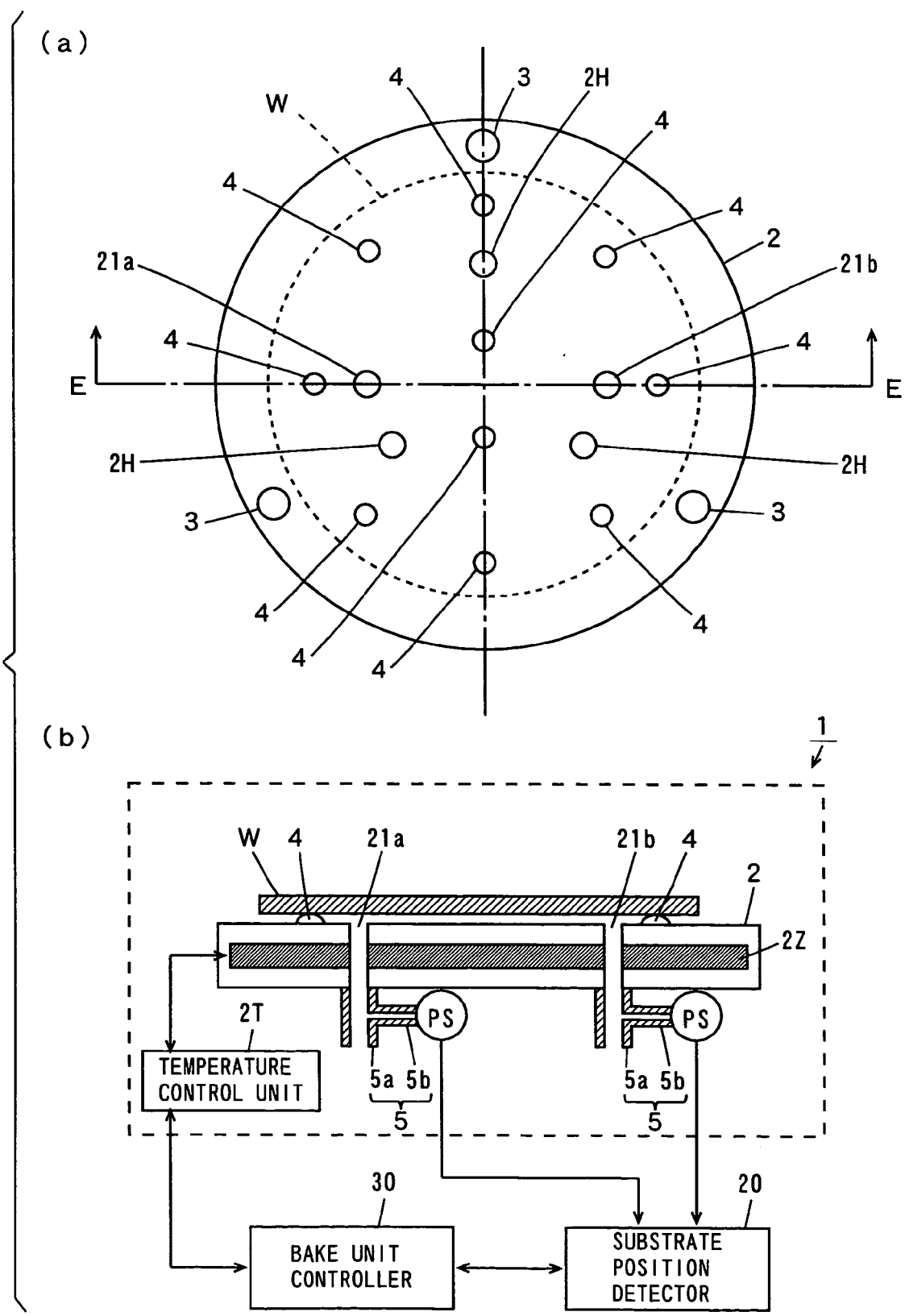
FIG. 14 is a schematic diagram for use in illustrating a thermal processing unit according to a second embodiment.

FIG. 14 is a schematic diagram for use in illustrating the thermal processing unit according to the second embodiment. FIG. 14(*a*) is a plan view showing the structure of a temperature control plate 2 of the thermal processing unit 1 according to the second embodiment. In FIG. 14(*a*), the broken line shows the position in which a substrate W is placed on the temperature control plate 2. FIG. 14(*b*) shows the structure of the thermal processing unit according to the second embodiment, most of which is a cross section along line E—E of FIG. 14(*a*).

As shown in FIG. 14(*a*), a plurality of (three, for example) positioning members 3 and a plurality of (ten, for example) substrate support pieces 4 are provided on the temperature control plate 2, as in the first embodiment. A plurality of (three, for example) pin inserting holes 2H are formed on a given concentric circle around the center of the temperature control plate 2.

The temperature control plate 2 is also provided with a plurality of fluid inserting holes 21*a*, 21*b*. Although the two fluid inserting holes 21*a*, 21*b* are provided in the temperature control plate 2 in the example of FIG. 14, three or more fluid inserting holes may be provided therein.

As shown in FIG. 14(*b*), pressure measuring pipes 5 are provided to lower ends of the respective fluid inserting holes 21*a*, 21*b* in the temperature control plate 2. The structure of each of the pressure measuring pipes 5 is similar to that shown in FIG. 1. The pressure measuring pipes 5 are connected to low differential pressure sensors PS via the branch pipes 5*b*, respectively.

The low differential pressure sensors PS provided to the respective fluid inserting holes 21*a*, 21*b* can accordingly detect pressures in airflows exhausted from the space surrounded by the substrate W and an upper face of the temperature control plate 2 via the respective branch pipes 5*b*.

Note that the low differential pressure sensors PS may each detect a pressure in an airflow supplied to the space surrounded by the substrate W and upper face of the temperature control plate 2 via the branch pipe 5*b*.

The plurality of low differential pressure sensors PS are each connected to the substrate position detector 20. Each of the plurality of low differential pressure sensors PS thus supplies a pressure signal corresponding to the pressure in the branch pipe 5*b* to the substrate position detector 20.

The substrate position detector 20 generates a plurality of comparison detecting value signals based on the pressure signals supplied from the plurality of low differential pressure sensors PS and a delay time supplied in advance from the bake unit controller 30 to supply the plurality of generated signals to the bake unit controller 30. The bake unit controller 30 supplies the substrate position detector 20 with a comparison detecting value reset signal.

The bake unit controller 30 can thus obtain the plurality of comparison detecting value signals. At the time, the bake unit controller 30 determines whether each of the plurality of comparison detecting value signals is logic "1" or not.

The bake unit controller 30 determines that the substrate W is in its normal position when all of the plurality of signals are logic "1", thereby completing the detection of the substrate W position.

In contrary, the bake unit controller 30 determines that the substrate W is in an abnormal position when not all of the plurality of signals are logic "1", and supplies an alarm signal to a host controller, alarm device or the like (not shown).

FIG. 14(*b*) shows a temperature control unit 2T and a temperature controller 2Z for controlling the substrate W placed on the temperature control plate 2 to a given temperature.

The temperature control unit 2T is connected to the bake unit controller 30, and controls the temperature controller 2Z based on a temperature control setting signal described below supplied from the bake unit controller 30. The temperature controller 2Z is a heater or Peltier element, for example, which controls the temperature of the substrate W on the temperature control plate 2 in accordance with the control of the temperature control unit 2T.

In the thermal processing unit 1 according to the second embodiment having the above described structure, variations in the airflows in the space formed between the substrate W and upper face of the temperature control plate 2, i.e., variations in the pressures, are detected by the plurality of pressure measuring pipe 5 and low differential pressure sensors PS at a plurality of spots on the temperature control plate 2. Then, the position of the substrate W on the temperature control plate 2 is determined by the substrate position detector 20 and bake unit controller 30, based on the plurality of detection results.

As a result, the position of the substrate W is determined based on the plurality of detection results of the variations in the pressures caused by lifting or lowering the substrate W, leading to higher precision in detecting a shifted position of the substrate W. This further makes it possible to detect an abnormality in the processing step of the substrate W.

The abnormality in the processing step of the substrate W (hereinafter called a processing abnormality) refers to a case where minute foreign matters such as pieces of a broken substrate W remain on the temperature control plate 2, so that part of the substrate W rides on the foreign matters. In this case, the whole surface of the substrate W cannot be uniformly treated.

In this embodiment, The low differential pressure sensors PS are used for detecting variations in the airflows in the space formed between the substrate W and upper face of the temperature control plate 2; however, the detection of the variations in airflows may be carried out by the flow rate sensors FL as in the first embodiment.

It is preferred here that the arrangement of the plurality of fluid inserting holes 21*a*, 21*b* provided in the temperature control plate 2 is determined in view of the following point.

As already shown in the first embodiment, detection of the substrate W position by the substrate position detector 20 and bake unit controller 30 is based on a small pressure fluctuation in the space surrounded by the substrate W and upper face of the temperature control plate 2.

When the substrate W is inclined in a given direction on the temperature control plate 2, the small pressure fluctuation changes depending on the position on the temperature control plate 2.

This is because with the substrate W being inclined in a given direction the distance between the substrate W and temperature control plate 2 differs depending on the position on the temperature control plate 2. The distance between the substrate W and temperature control plate 2 at a particular position on the temperature control plate 2 will, hereinafter, be called a gap.

A preferred arrangement of the fluid inserting holes 21a, 21b on the temperature control plate 2 will now be described.

Figure 15:
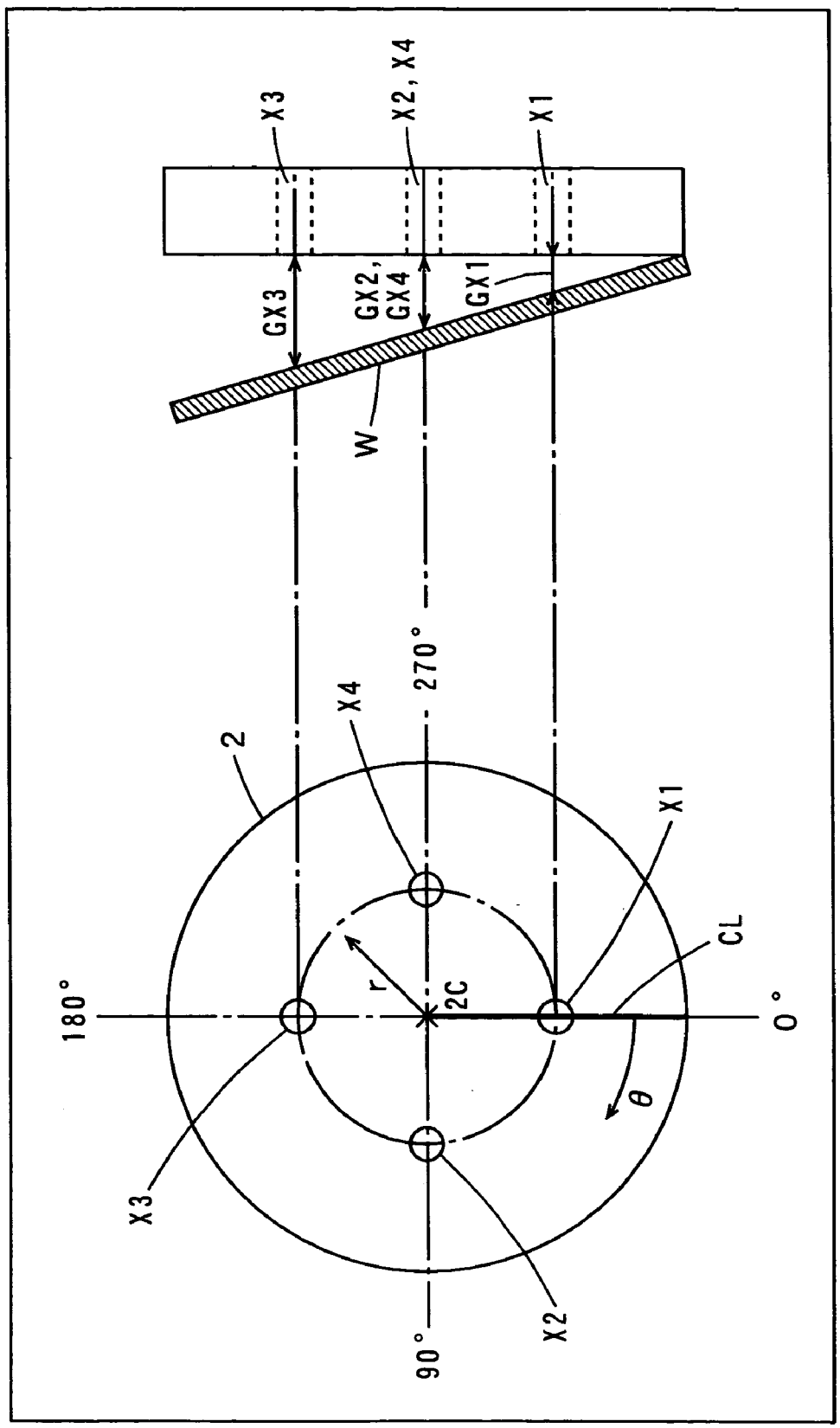
FIG. 15 is a schematic diagram showing gaps between the inclined substrate and temperature control plate.

FIG. 15 is a schematic diagram showing gaps between the inclined substrate W and temperature control plate 2.

In FIG. 15, there is shown a plan view and a side view of the thermal processing unit 1. The side view of FIG. 15 shows the substrate W being placed in a position inclined in a given direction.

The plan view of FIG. 15 shows positions X1, X2, X3, X4 defined at equal intervals on a concentric circle at a distance r away from a plate center 2C of the temperature control plate 2.

Here, with the plate center 2C on the temperature control plate 2 as an original point, and the thick line CL drawn between the plate center 2C and position X1 as a reference, an angle of rotation in the clockwise direction is defined as an angle θ. The position X1 is thus positioned in a direction where the angle θ is 0 degree, the position X2 in a direction where the angle θ is 90 degrees, the position X3 in a direction where the angle θ is 180 degrees, and the position X4 in a direction where the angle θ is 270 degrees.

Here, as shown in the side view of FIG. 15, the substrate W is inclined in such a manner that it forms a largest gap in the position where the angle θ is 180 degrees.

In this case, the size of the gap becomes larger as the angle θ increases from 0 to 90 degrees, even larger as the angle θ increases from 90 to 180 degrees, smaller as the angle θ increases from 180 to 270 degrees, and even smaller as the angle θ increases from 270 to 360 degrees.

As for the gaps at the respective positions X1, X2, X3, X4, therefore, the gap GX1 is the smallest, the gaps GX2, GX4 are about intermediate, and the gap GX3 is the largest.

As described above, the small pressure fluctuation that occurs in the space between the substrate W and temperature control plate 2 depends on the size of the gap. The larger the gap becomes, smaller the pressure fluctuation, and the smaller the gap becomes, greater the pressure fluctuation.

Since a gap is hardly formed when the substrate W is in its normal position on the temperature control plate 2, the pressure fluctuation remains the largest at any position on the temperature control plate 2.

When, on the other hand, the substrate W is inclined on the temperature control plate 2, gaps are larger than that when the substrate is in its normal position, resulting in a smaller pressure fluctuation.

However, even if the substrate W is inclined on the temperature control plate 2, the pressure fluctuation at a position of smaller gap is close to the pressure fluctuation when the substrate W is in its normal position. This may cause an erroneous determination that the substrate W is in its normal position when a gap at the position of a fluid inserting hole is small, although the substrate W is inclined on the temperature control plate 2.

In the example of FIG. 15, the probability of an erroneous determination is the highest when a fluid inserting hole is provided on the position X1, about intermediate at the position X2 or X4, and the lowest at the position X3.

When the inclined direction of the substrate W varies, however, the probability of an erroneous determination at each of the positions X1, X2, X3, X4 also varies depending on the inclined direction of the substrate.

Considering the inclined direction of the substrate W, positions on the temperature control plate 2, and probability of an erroneous determination, it is preferred that the two fluid inserting holes 21a, 21b are provided at the positions X1, X3 of FIG. 15, respectively, or at the positions X2, X4 of FIG. 15, respectively.

By providing the fluid inserting holes 21a, 21b in the above manner on the temperature control plate 2, the gap at either position of the fluid inserting holes 21a or 21b becomes about intermediate or higher, regardless of the inclined direction of the substrate W. Therefore, the probability of an erroneous determination becomes about intermediate or lower at either position of the fluid inserting holes 21a, 21b. As a result, the precision in detecting the substrate W position is improved.

In the thermal processing unit 1 according to the second embodiment, three fluid inserting holes may be provided in the temperature control plate 2, as described above. In this case, the three fluid inserting holes are arranged, for example, at any of the positions X1, X2, X3, X4 of FIG. 15, respectively.

In this case, the probability of an erroneous determination is about intermediate or lower at any of the three fluid inserting holes regardless of the inclined direction of the substrate W, with an increase of spots at which the substrate W position is detected. Therefore, the precision in detecting the substrate W position is further improved.

Figure 16:
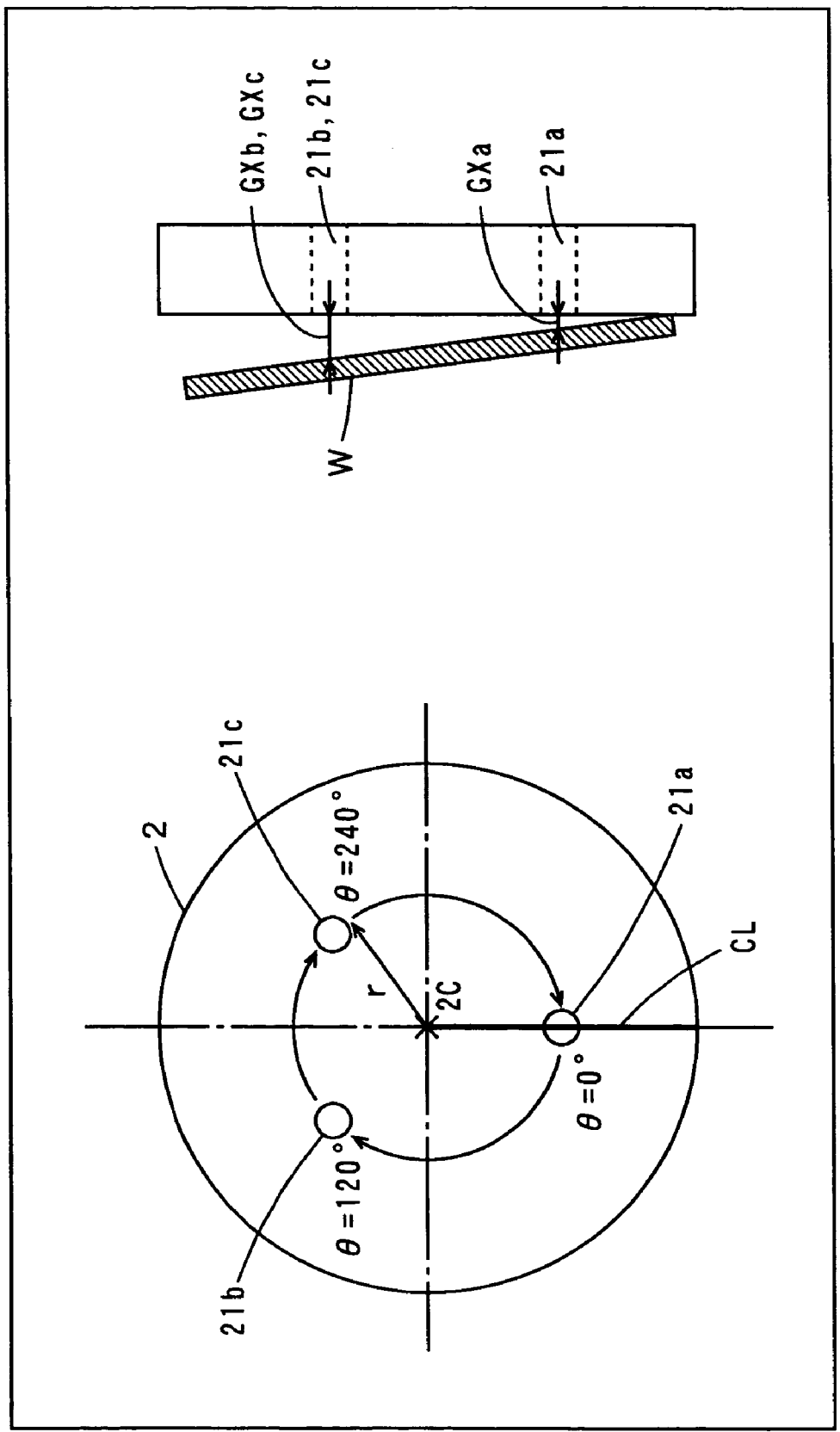
FIG. 16 is a plan view of the temperature control plate with three fluid inserting holes.

When three fluid inserting holes are provided on the temperature control plate 2, it is preferred that each of the fluid inserting holes is arranged as follows. FIG. 16 is a plan view of the temperature control plate 2 with three fluid inserting holes.

In FIG. 16, fluid inserting holes 21a, 21b, 21c are provided at equal intervals on a concentric circle at a distance r away from the plate center 2C of the temperature control plate 2.

As in FIG. 15, the angle of rotation in the clockwise direction is defined as an angle θ with the thick line CL drawn between the plate center 2C and position X1 as a reference. In this case, the fluid inserting hole 21a is positioned in a direction where the angle θ is 0 degree, the fluid inserting hole 21b in a direction where the angle θ is 120 degrees, and the fluid inserting hole 21c in a direction where the angle θ is 240 degrees.

Here, gaps formed at the positions of the fluid inserting holes 21a, 21b, 21c due to the inclined direction of the substrate W are defined as gaps GXa, GXb, GXc, respectively.

In this case, at least one of the gaps GXa, GXb, GXc is larger than the gap of about intermediate size explained in FIG. 15, regardless of the inclined direction of the substrate W.

This means that the probability of an erroneous determination becomes even lower than about an intermediate probability at any of the positions of fluid inserting holes 21a, 21b, 21c. As a result, the precision in detecting the substrate W position is further improved.

In the thermal processing unit 1 according to the second embodiment, four fluid inserting holes may be provided in the temperature control plate 2. In this case, the four fluid inserting holes are arranged, for example, at the positions X1, X2, X3, X4 of FIG. 15, respectively.

In this case, the probability of an erroneous determination is about intermediate or lower at any of the four fluid inserting holes regardless of the inclined direction of the substrate W, with an increase of spots at which the substrate W position is detected. Therefore, the precision in detecting the substrate W position is further improved.

In the embodiment, the number of the fluid inserting holes to be provided on the temperature control plate 2 may be of any plural number as described above, and detection sensitivity for the substrate W position is improved as the number increases. Also, when the number of the fluid inserting holes is increased, it is preferred that the arrangement of each fluid inserting hole is made in view of the above point.

Note that in FIG. 15, the pressure fluctuation that occurs on the temperature control plate 2 when the substrate W is placed thereon varies considerably also depending on the distance r between the positions X1, X2, X3, X4 and the plate center 2.

In FIG. 15, the pressure fluctuation at the position X3 becomes greater as the distance r from the plate center 2C increases. Thus, when a fluid inserting hole is provided on the position X3, the probability of an erroneous determination gradually decreases as the distance r is set greater.

Assume, for example, that a temperature control plate 2 corresponding to a substrate W of 300 mm diameter is provided with the fluid inserting holes 21a, 21b at the positions X1, X3 of FIG. 15, with the distance r from the plate center 2C being 80 mm or greater.

When the fluid inserting holes 21a, 21b are thus provided with the distance r being 80 mm or greater, the substrate position detector 20 and bake unit controller 30 are capable of detecting a gap of 0.5 mm or larger formed because of a shifted position or processing abnormality of the substrate W, based on the pressure fluctuations in the fluid inserting holes 21a, 21b.

As described above, when the temperature control setting signal is input to the temperature control unit 2T from the bake unit controller 30, the temperature control unit 2T carries out the control of the temperature controller 2Z. This causes the substrate W placed on the temperature control plate 2 to be controlled to a given temperature. This given temperature will be called a processing temperature. Note that the processing temperature is set in advance by the bake unit controller 30.

When the processing temperature on the temperature control plate 2 is varied by the temperature control setting signal from the bake unit controller 30, the above mentioned pressure value detecting waveform is also varied in accordance with the processing temperature.

Note that the bake unit controller 30 stores in advance a table representing a relationship between the processing temperature and the delay time to be set for the temperature position detector 20. When the above mentioned temperature control setting signal is generated by a user, the bake unit controller 30 extracts based on the table a delay time corresponding to the processing temperature represented by the temperature control setting signal for supply to the substrate position detector 20.

Figure 17:
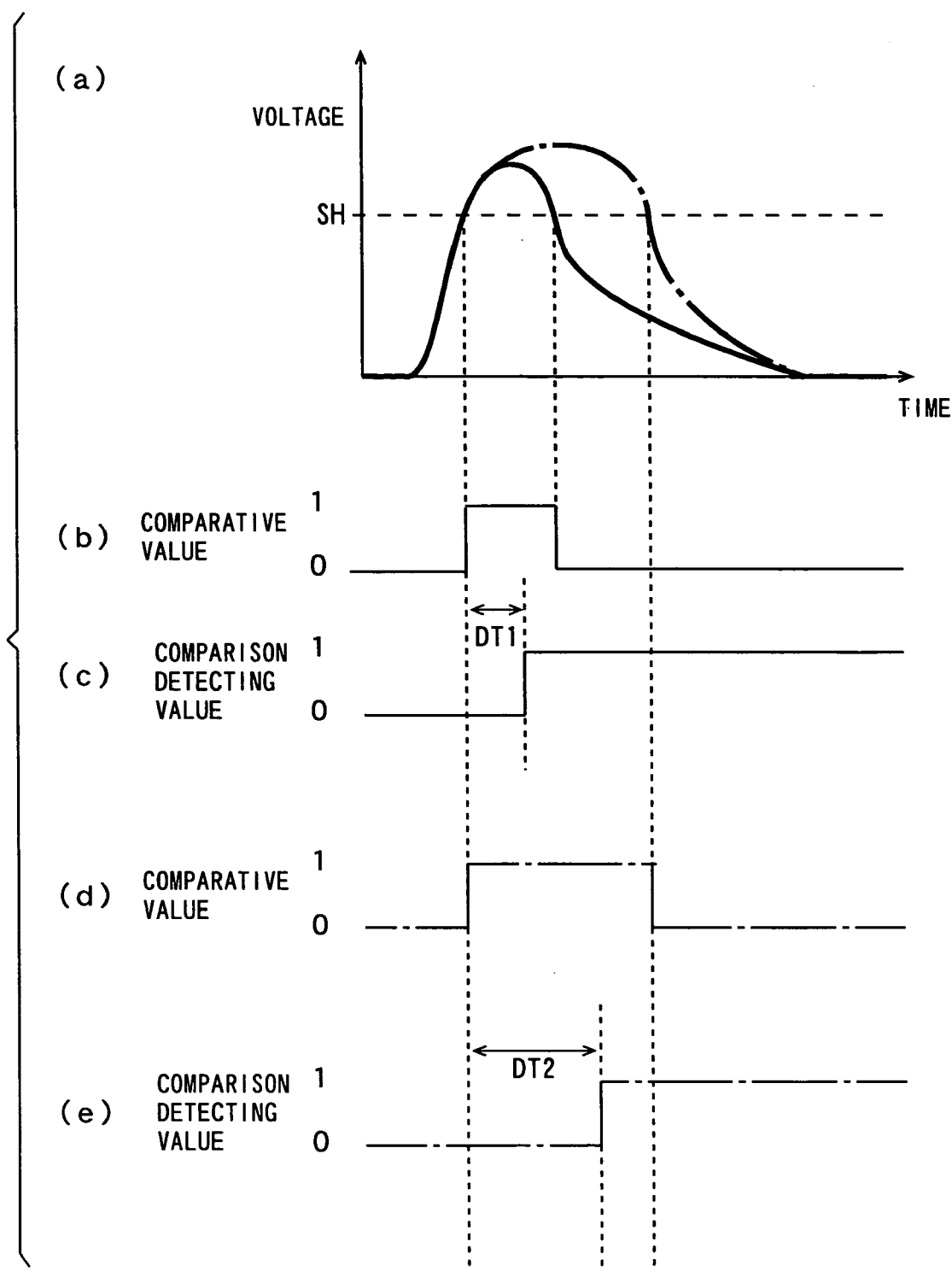
FIG. 17 is a diagram showing examples of the pressure value detecting waveforms corresponding to processing temperatures of the substrate, comparison values, and comparison detecting values.

FIG. 17 is a diagram showing examples of the pressure value detecting waveforms corresponding to processing temperatures of the substrate W, comparison values, and comparison detecting values.

In FIG. 17(a), the solid line represents a pressure value detecting waveform at a comparatively low processing temperature, and the chain line represents a pressure value detecting waveform at a comparatively high processing temperature. Similarly to FIG. 5(a), the ordinate represents voltage, and the abscissa represents time. A given threshold value SH represented by the broken line is set for the substrate position detector 20 also in this example.

Referring to FIG. 17(a), a change in the pressure value detecting waveform at a high processing temperature extends in the direction of time axis longer than that of the waveform at a low processing temperature. Such extension of the pressure value detecting waveform is probably because an increased temperature causes the thermal expansion of the air in the space above the temperature control plate 2.

FIG. 17(b) shows a comparison value generated at a low processing temperature, based on the threshold value SH of FIG. 17(a). The substrate position detector 20 is supplied from the bake unit controller 30 with a delay time DT1 corresponding to the low temperature.

The delay time DT1 is thus set for the substrate position detector 20. The comparison detecting value of FIG. 17(c) is generated based on the delay time DT1.

FIG. 17(d), on the other hand, shows a comparison value generated at a high processing temperature, based on the threshold value SH of FIG. 17(a). The substrate position detector 20 is supplied from the bake unit controller 30 with a delay time DT2 corresponding to the high temperature.

The delay time DT2 is thus set for the substrate position detector 20. The comparison detecting value of FIG. 17(e) is generated based on the delay time DT2.

In the second embodiment, the delay time is set in accordance with the processing temperature in such a manner. This prevents an erroneous determination for the substrate W position due to a difference in the pressure value detecting waveforms depending on the processing temperature. The erroneous determination here means, for example, as follows.

Assume that a constant delay time DT1 as shown in FIG. 17 is set for the substrate position detector 29 without taking into account processing temperatures.

At a high processing temperature, a change in the pressure value detecting waveform extends long in the direction of time axis as described above. The comparison value therefore may not turn to logic "0" before the delay time DT1 elapses, even if the substrate W is in an abnormal position. This causes the bake unit controller 30 to make an erroneous determination that the substrate W is in its normal position, although the substrate W is in fact in an abnormal position.

Next, assume that a constant delay time DT2 as shown in FIG. 17(c) is set for the substrate position detector 20 without taking into account processing temperatures.

At a low processing temperature, a change in the pressure value detecting waveform shrinks in the direction of time axis. In this case, the comparison value may turn to logic "0" before the delay time DT2 elapses, even if the substrate W is in its normal position. This causes the bake unit controller 30 to make an erroneous determination that the substrate W is in an abnormal position, even if the substrate W is in its normal position.

In the second embodiment, the creation of the table stored in the bake unit controller 30 involves, for example, measuring, at a plurality of processing temperatures, the pressure value detecting waveforms corresponding to a plurality of positions on the substrate W when it is lowered, and then calculating an optimum delay time corresponding to each processing temperature based on the measurement results.

Figure 18:
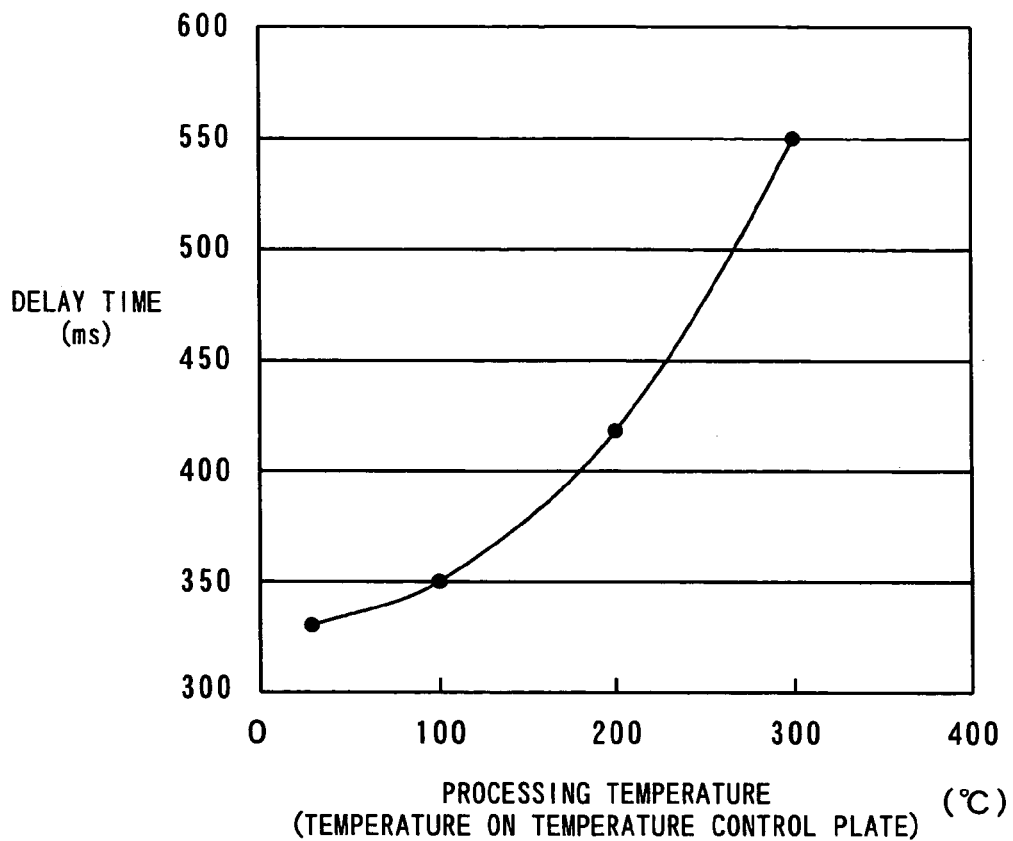
FIG. 18 shows an example of a table stored in the bake unit controller.

FIG. 18 shows an example of the table stored in the bake unit controller 30. In FIG. 18, the ordinate represents delay time, and the abscissa represents processing temperature (i.e., temperature on the temperature control plate). Referring to FIG. 18, the optimum delay time rises with an increase in the processing temperature, forming a quadratic curve.

In the thermal processing unit 1 according to the second embodiment, a delay time corresponding to the processing temperature of the substrate W is extracted from the table shown in FIG. 18, and the position of the substrate W is determined by the substrate position detector 20 and the bake unit controller 30 based on the extracted delay time.

This prevents an erroneous determination of the position of the substrate W, while enabling a detection of a shifted position of the substrate W and a processing abnormality thereof with high precision.

Although the thermal processing unit 1 has been described as the substrate processing unit according to the embodiment, the above described structure may be applied to the thermal processing unit PHP, hotplate HP, cooling plate CP, and adhesion agent coater AHL according to the first embodiment.

Note that when a substrate is lowered, the length of the change in the pressure value detecting waveform in the time axis direction becomes longer than that obtained when the substrate is lifted. The long length of the change in the pressure value detecting waveform in the time axis direction makes it easier to determine the position of the substrate W. It is accordingly preferred that the position of the substrate W is determined based on a variation in the pressure in the space between the substrate W and temperature control plate 2 when the substrate W is lowered.

In the thermal processing unit PHP, hotplate HP, and adhesion agent coater AHL, in particular, a stable pressure value detecting waveform can be obtained when the substrate W of room temperature is carried thereto and lowered by the substrate lifting pins 6.

On the other hand, the substrate W carried into the cooling plate CP is normally heated to a given processing temperature. When the substrate W heated to a given processing temperature is lowered by the substrate lifting pins 6 above the temperature control plate 2, a temperature difference between the substrate W and temperature control plate 2 causes an abrupt heat transfer. This causes a temperature difference between the center of the substrate W and the periphery thereof, resulting in deformation of the substrate W. This makes it difficult for the low differential pressure sensor PS to obtain the stable pressure value detecting waveform as shown in FIG. 5(*a*) or FIG. 17(*a*), even if the substrate W is in its normal position.

For this reason, for application of the structure of the thermal processing unit 1 to the cooling plate CP in the second embodiment, it is preferred that the position of the substrate W is determined based on a variation in the pressure in the space between the substrate W and temperature control plate 2 when the substrate W is lifted by the substrate lifting pins 6 of FIG. 1.

In the second embodiment above, the pressure value detecting waveforms from the plurality of low differential pressure sensors are processed by the substrate position detector 20, and the position of the substrate W is determined by the bake unit controller 30 based on the plurality of comparison detecting value signals. The substrate W position is thus determined based on the comparison detecting value signals obtained from the pressure value detecting waveforms from the plurality of low differential pressure sensors PS, so that the precision in determining the substrate W position is improved.

Moreover, variations in the airflows in the space between the substrate W and temperature control plate 2 are detected by the plurality of low differential pressure sensors PS, and the substrate W position is determined based on the plurality of pressure detecting value waveforms from the plurality of low differential pressure sensors, so that the precision in determining the substrate W position is further improved. This makes it possible to determine not only whether the substrate W is in its normal position but also a processing abnormality of the substrate W on the temperature control plate 2.

As described above, the pressure value detecting waveforms from the low differential pressure sensors PS differ depending on the processing temperatures of the substrate W. In this case, the temperature of the substrate W placed on the temperature control plate 2 is controlled to a given processing-temperature by the temperature control unit 2T and temperature controller 2Z. Then, the substrate position detector 20 performs a delay filter processing based on the delay time corresponding to the processing temperature.

This leads to a determination of the position of the substrate W on the temperature control plate 2 in accordance with the processing temperature of the substrate W. Note that the delay time corresponding to the processing temperature of the substrate W is set by the substrate position detector 20 and bake unit controller 30.

(Third Embodiment)

A substrate processing unit according to a third embodiment differs from the substrate processing unit 1 according to the first embodiment as follows.

The structure of the thermal processing unit according to the third embodiment is used for the adhesion agent coater AHL described mainly in the first embodiment. The adhesion agent coater AHL will hereinafter be described.

Figure 19:
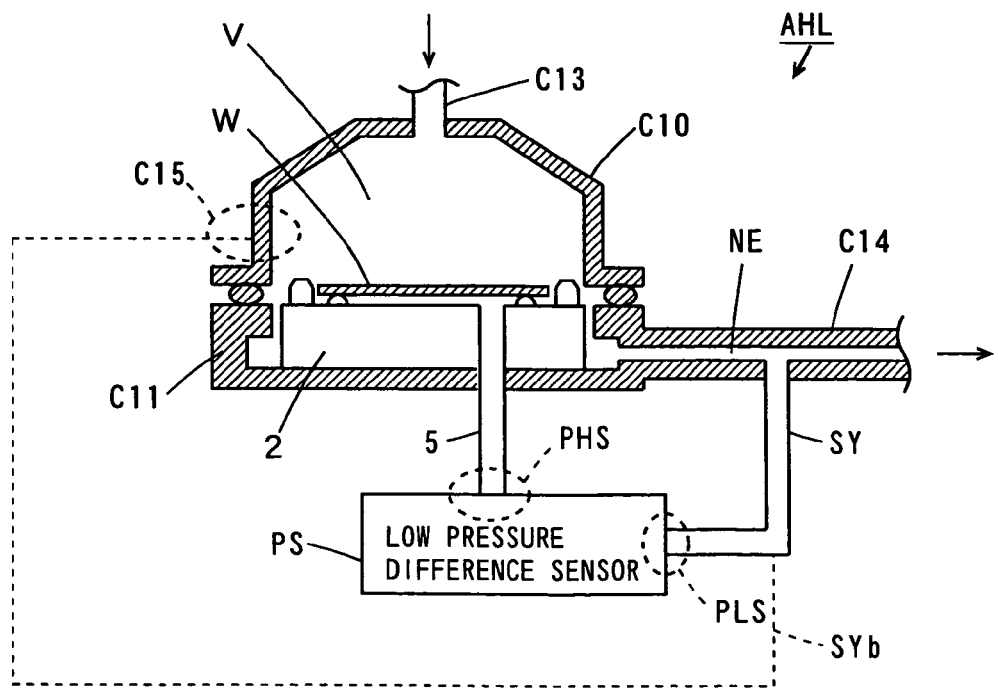
FIG. 19 is a schematic diagram showing the structure of an adhesion agent coater according to a third embodiment.

FIG. 19 is a schematic diagram showing the structure of the adhesion agent coater AHL according to the third embodiment.

As shown in FIG. 19, the adhesion agent coater AHL of the third embodiment includes a sealing lid C10 and a plate holding base C11 in addition to the structure of the thermal processing unit of the first embodiment.

The plate holding base C11 is provided to cover a lower part of the temperature control plate 2. The sealing lid C10 is provided so that it can be freely opened and closed above the plate holding base C11. Closing the sealing lid C10 causes the space over the temperature control plate 2 to be a sealed space V.

An exhaust pipe C14 is provided on a side face of the plate holding base C11. A space NE inside the exhaust pipe C14 communicates with the aforementioned sealed space V. Atmosphere inside the sealed space V is exhausted via the space NE inside the exhaust pipe C14. This causes the pressure within the sealed space V to be reduced.

Meanwhile, a gas supply pipe C13 is provided at the top of the sealing lid C10. The gas supply pipe C13 supplies HMDS (Hexamethyldisilazane) or nitrogen gas (an inert gas) to the inside of the sealed space V. HMDS is used here as an adhesion agent.

In the adhesion agent coater AHL having such a structure, a substrate W is initially carried and placed onto the temperature control plate 2 with the sealing lid C10 being open. The sealing lid is subsequently closed, and the atmosphere inside the sealed space V is exhausted from the exhaust pipe C14. This causes the pressure within the sealed space V to be reduced. Then, HMDS is supplied from the gas supply source C13, so that the substrate W kept at a given processing temperature by the temperature control plate 2 undergoes adhesion reinforcement.

At the completion of adhesion reinforcement using HMDS, the atmosphere inside the sealed space V is again exhausted from the exhaust pipe C14. Nitrogen gas is subsequently supplied from the gas supply source C13 into the sealed space V for replacement of the atmosphere inside the sealed space V.

Lastly, the sealing lid C10 is opened, and the substrate W which has undergone adhesion reinforcement is removed from the temperature control plate 2.

By the way, the low differential pressure sensor PS has two ports PHS, PLS as shown in FIG. 19. The two ports PHS, PLS are connected to given spaces, respectively. This allows the low differential pressure sensor PS to measure a pressure difference between the space to which one port PHS is connected and the space to which the other port PLS is connected.

In the third embodiment, the one port PHS of the low differential pressure sensor PS is connected to the sealed space V via the pressure measuring pipe 5 provided below the temperature control plate 2. The other port PSL is connected to the space NE inside the exhaust pipe C14 via a differential pressure measuring pipe SY.

The low differential pressure sensor PS is used for detecting a small pressure fluctuation in the space between the substrate W and temperature control plate 2 caused by lifting or lowering the substrate W.

When the pressure inside the sealed space V is reduced as in the above adhesion agent coater AHL, connection of the one port PHS to the pressure measuring pipe 5 with the other port PLS being open to atmosphere may result in measurements of very large pressure differences. This may cause a breakage of the low differential pressure sensor PS.

For this reason, the above two ports PHS, PLS are connected to the spaces communicating with each other (sealed space V and space NE) in this embodiment. Such connection provides a small pressure difference between the space to which the one port PHS is connected and the space to which the other post PLS is connected, with the pressure inside the sealed space V being reduced. This prevents a breakage of the low differential pressure sensor PS.

When the one port PHS of the low differential pressure sensor PS is connected to the space between the substrate W and temperature control plate 2 via the pressure measuring pipe 5 in the third embodiment, the other port PLS thereof may be connected to a space in the sealed space V except between the substrate W and temperature control plate 2.

The dotted line of FIG. 19 shows an example in which part of the sealing lid C15 is provided with an opening C15, and a differential pressure measuring pipe SYb is provided to connect the opening C15 and the port PLS. In this case also, the space between the substrate W and temperature control plate 2 to which the one port PHS of the low differential pressure sensor PS is connected is included in the sealed space V to which the other port PLS is connected, resulting in a small pressure difference between the space to which the one port PHS is connected and the space to which the other port PLS is connected. This prevents a breakage of the low differential pressure sensor PS.

In the third embodiment, the atmosphere in the sealed space V is exhausted from the exhaust pipe C14 for pressure reduction. In this case also, since the space between the substrate W and temperature control plate 2 communicates with the space NE inside the exhaust pipe C14, the pressure difference between these spaces will not become excessive. As a result, a breakage of the low differential pressure sensor PS due to an excessive pressure difference is prevented, when the two ports PHS, PLS of the low differential pressure sensors PS are connected to the space between the substrate W and temperature control plate 2 and the space NE inside the exhaust pipe C14, respectively.

Note also that the pressure difference between the spaces will not become excessive when the two ports PHS, PLS of the low differential pressure sensor are connected to the space between the substrate W and temperature control plate 2 and to the sealed space V except the space between the substrate W and temperature control plate 2, respectively. As a result, a breakage of the low differential pressure sensor PS due to an excessive pressure difference is prevented.

Note that more than one fluid inserting holes provided in the temperature control plate 2 and low differential pressure sensors PS may be provided in the third embodiment as in the second embodiment, although reference thereto is not made herein.

In addition, similarly to the second embodiment, the substrate position detector 20 and bake unit controller 30 may determine the position of the substrate W using a delay time corresponding to the processing temperature of the substrate W.

(Fourth Embodiment)

A substrate processing unit according to a fourth embodiment differs from the substrate processing unit 1 according to the first embodiment as follows.

Figure 20:
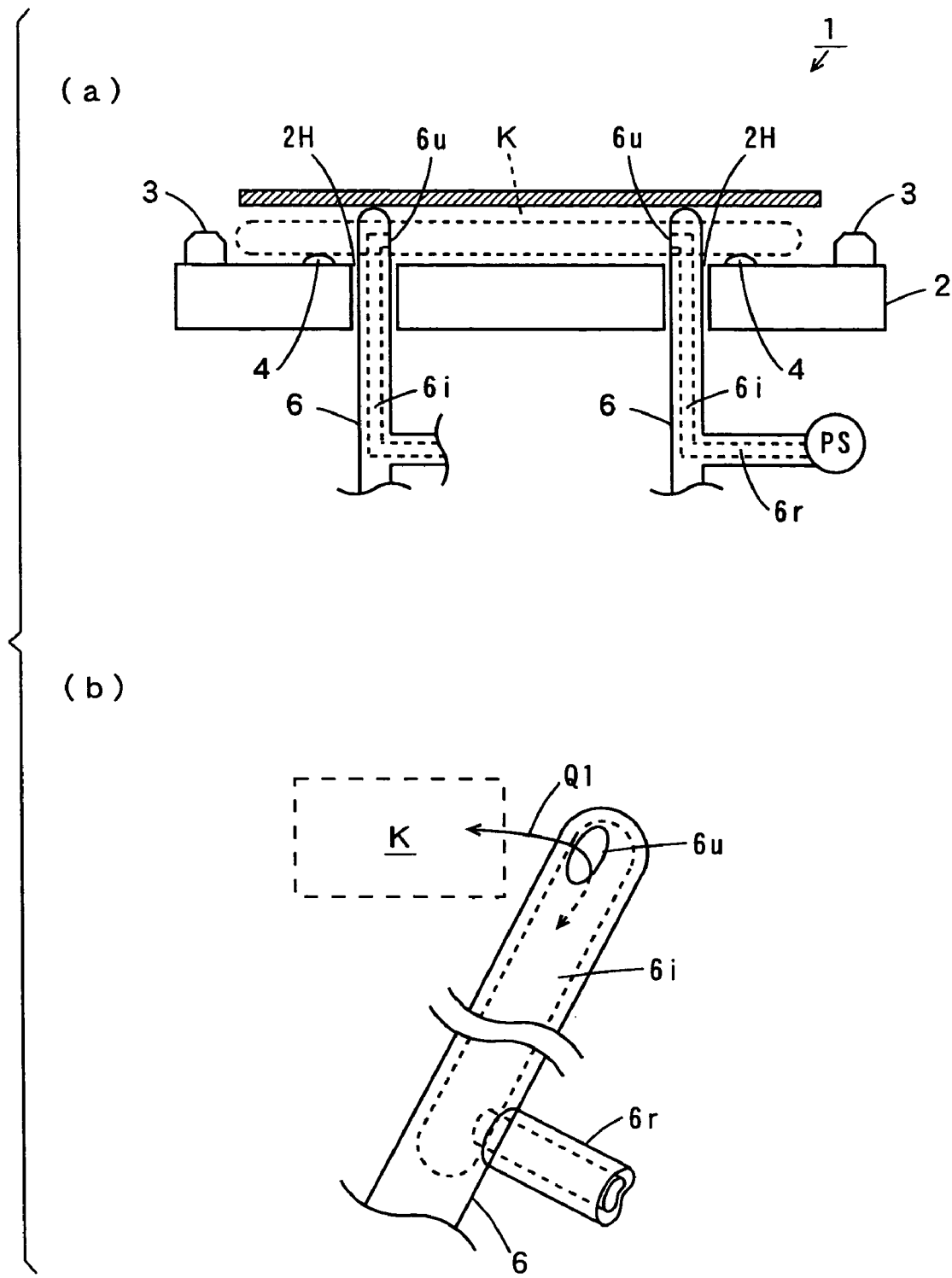
FIG. 20 is a schematic diagram showing examples of the components and structures of a thermal processing unit and substrate lifting pins according to a fourth embodiment.

FIG. 20 is a schematic diagram showing examples of the components and structures of a thermal processing unit and substrate lifting pins according to the fourth embodiment. FIG. 20(a) shows the components of the thermal processing unit 1 according to the fourth embodiment.

As shown in FIG. 20(a), the thermal processing unit 1 according to the embodiment does not comprise the pressure measuring pipe 5 of FIG. 1. The structure of the substrate lifting pin 6 according to the embodiment also differs from that of the substrate lifting pin 6 according to the first embodiment.

FIG. 20(b) shows a detailed structure of the substrate lifting pin 6 according to the embodiment. As shown in FIG. 20(b), an airflow path 6i is provided inside each of the plurality of substrate lifting pins 6. Near an upper part of the substrate lifting pin 6 is provided with an upper opening 6u communicating the space K formed between the substrate W and upper face of the temperature control plate 2 and the airflow path 6i.

In addition, one end of a branch pipe 6r is connected to the substrate lifting pin 6 in such a position that it remains below the temperature control plate 2 when the substrate lifting pin 6 is lifted or lowered. The branch pipe 6r has its other end connected to the low differential pressure sensor PS.

When the substrate W is lifted or lowered, an airflow is induced in the airflow path 6i by drawing in and out of air, as indicated by the arrow Q1.

Then, the pressure of the airflow induced in the airflow path 6i is detected by the low differential pressure sensor PS connected to the branch pipe 6r. The low differential pressure sensor PS thus supplies a signal corresponding to the pressure of the airflow in the airflow path 6i to the substrate position detector 20 as the pressure signal shown in the first embodiment.

In this manner, it is possible in the fourth embodiment to detect a pressure fluctuation in the space K between the substrate W and temperature control plate 2 by the airflow path 6i provided inside the substrate lifting pin 6, branch pipe 6r connected to the substrate lifting pin 6, and low differential pressure sensor PS, thereby determining the position of the substrate W on the temperature control plate 2.

This eliminates the need to provide the pressure measuring pipe 5 used in the first embodiment, and therefore the position of the substrate W on the temperature control plate 2 can be determined with a simple structure.

In addition, the provision of the upper opening 6u near the upper part of the substrate lifting pin 6 allows the low differential pressure sensor PS to detect a pressure fluctuation right under the substrate W. This improves the precision in detecting a pressure fluctuation.

In the fourth embodiment above, the plurality of substrate lifting pins 6 are lifted and lowered in the pin inserting holes 2H by the lifting device 8 to lift and lower the substrate W.

Then, a variation in the airflow passing through the airflow path 6i when the plurality of substrate lifting pins 6 are lifted or lowered is detected by the low differential pressure sensor PS. This eliminates the need to provide, additional air path for detecting an airflow variation, thereby making it possible to detect a shifted position of the substrate W with a simple structure.

In the fourth embodiment, a flow rate sensor FL may be provided in place of the low differential pressure sensor PS to detect a variation in the airflow induced in the airflow path 6i for determination of the substrate W position.

In the first to fourth embodiments described above, the thermal processing unit 1, substrate position detector 20, and bake unit controller 30 correspond to a substrate processing unit; the temperature control plate 2 corresponds to a substrate support plate; the substrate lifting pins 6, coupling member 7, and lifting device 8 correspond to a lifting device; the pressure measuring pipe 5, flow rate measuring pipe 5B, low differential pressure sensor PS, and flow rate sensor FL correspond to a detector; the substrate position detector 20 and bake unit controller 30 correspond to a determiner; low differential pressure sensor PS corresponds to a pressure detector; the flow rate sensor FL corresponds to a flow rate detector; and pin inserting holes 2H, fluid inserting holes 2J, and fluid inserting holes 21a, 21b, 21c correspond to through holes.

Further, the pin inserting holes 2H correspond to a plurality of through holes; the substrate lifting pins 6 correspond to a plurality of support members; the lifting device 8 corresponds to a driving device; the low differential pressure sensor PS and flow rate sensor FL correspond to a sensor; the pressure signal corresponds to an output signal; the substrate position detector 20 corresponds to a processor; the bake unit controller 30 corresponds to a controller; and the comparison detecting value signal corresponds to a comparison signal.

Further, the low differential pressure sensor PS corresponds to a differential pressure sensor; the space between the substrate W and temperature control plate 2 corresponds to a first space; the space NE inside the exhaust pipe C14 corresponds to a second space; the sealing lid C10 and plate holding base C11 correspond to a sealing container; and the exhaust pipe C14 corresponds to an exhaust pipe.

The airflow path 6i and upper opening 6u correspond to a path. The comparison value and comparison detecting value signal correspond to a processing result; the temperature control unit 2T and temperature controller 2Z correspond to a temperature controller; and the substrate position detector 20 and bake unit controller 30 correspond to a setter.

The indexer robot IR and first, second, third, and fourth center robots CR1, CR2, CR3, CR4 correspond to a transport device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing unit for performing a given processing to a substrate, comprising:
    a substrate support plate on which a substrate is placed;
    a lifting device that lifts and lowers the substrate above said substrate support plate;
    a detector that detects a variation in the airflow in a space between the substrate and said substrate support plate when the substrate is lifted or lowered by said lifting device; and
    a determiner that determines the position of the substrate on said substrate support plate based on the variation in the airflow detected by said detector.

2. The substrate processing unit according to claim 1, wherein
    said detector includes a pressure detector that detects a pressure variation due to said variation in the airflow.

3. The substrate processing unit according to claim 2, wherein
    said pressure detector is a differential pressure sensor for detecting a pressure difference between a first space and a second space,
    said first space being a space between said substrate support plate and the substrate,
    said second space being a space communicating with said first space.

4. The substrate processing unit according to claim 3, further comprising a sealing container that houses said substrate support plate, and
    an exhaust pipe for exhausting atmosphere inside said sealing container,
    said second space being a space inside said exhaust pipe.

5. The substrate processing unit according to claim 3, further comprising:
    a sealing container that houses said substrate support plate; and
    an exhaust pipe for exhausting atmosphere in said sealing container,
    said second space being a space inside said sealing container except the space between said substrate support plate and the substrate.

6. The substrate processing unit according to claim 1, wherein
    said detector includes a flow rate detector that detects a flow rate variation due to said variation in the airflow.

7. The substrate processing unit according to claim 1, wherein
    said substrate support plate has a vertically penetrating through hole, and
    said detector detects a variation in the airflow passing through said through hole when the substrate is lifted or lowered by said lifting device.

8. The substrate processing unit according to claim 1, wherein
    said substrate support plate has a plurality of vertically penetrating through holes,
    said lifting device including:
    a plurality of support members provided so as to vertically move in said plurality of through holes; and
    a driving device that lifts and lowers said plurality of support members,
    said detector detecting a variation in the airflow passing through at least one of said plurality of through holes when said plurality of support members are lifted or lowered by said driving device.

9. The substrate processing unit according to claim 1, wherein
said substrate support plate has a plurality of vertically penetrating through holes,
said lifting device including:
a plurality of support members provided so as to vertically move in said plurality of through holes; and
a driving device that lifts and lowers said plurality of support members,
at least one of said support members having a path that opens to the space between said substrate support plate and the substrate,
said detector detecting a variation in the airflow passing through said path when said plurality of support members are lifted or lowered by said driving device.

10. The substrate processing unit according to claim 1, wherein
said detector includes at least one sensor that detects a pressure or a flow rate, the substrate processing unit further comprising:
a processor that processes a signal output from said at least one sensor; and
a controller that determines the position of the substrate on said substrate support plate based on a processing result from said processor while controlling the lifting and lowering operation by said lifting device.

11. The substrate processing unit according to claim 10, wherein
a plurality of said sensors are provided,
said processor processes signals output from said plurality of sensors, and
said controller determines the position of the substrate on said substrate support plate based on a plurality of processing results obtained from said processor.

12. The substrate processing unit according to claim 11, wherein
said controller determines whether or not the substrate is normally placed on said substrate support plate based on each of the plurality of processing results obtained from said processor, and determines that the substrate is normally placed on said substrate support plate, when all of the plurality of processing results are normal.

13. The substrate processing unit according to claim 10, wherein
said processor compares the signal output from said at least one sensor with a prescribed threshold value to output a comparison signal representing a comparison result, and
said controller determines the position of the substrate on said substrate support plate based on the comparison signal output from said processor.

14. The substrate processing unit according to claim 13, wherein
said processor performs a moving average processing to the signal output from said at least one sensor to compare a processed output signal with said threshold value.

15. The substrate processing unit according to claim 14, wherein
said processor compares the signal output from said at least one sensor and said threshold value, and performs a delay filter processing to said compared signal output from said at least one sensor.

16. The substrate processing unit according to claim 15, wherein
said substrate support plate includes a temperature controller that controls the substrate to a given processing temperature, and
said processor performs said delay filter processing based on a delay time corresponding to said processing temperature.

17. The substrate processing unit according to claim 16, further comprising a setter for setting said delay time in accordance with said processing temperature,
said processor performing said delay filter processing based on said delay time set by said setter.

18. The substrate processing unit according to claim 13, wherein
said controller resets said comparison signal from said processor to a given state prior to lifting or lowering of said plurality of support members by said driving device, and receives said comparison signal from said processor after lifting or lowering of said plurality of support members by said driving device.

19. A method for detecting the position of a substrate in which the position of a substrate on a substrate support plate is detected, comprising the steps of:
lifting or lowering a substrate above said substrate support plate;
detecting a variation in the airflow in a space between the substrate and said substrate support plate when said substrate is lifted or lowered; and
determining the position of the substrate on said substrate support plate based on said detected variation in the airflow.

20. A substrate processing apparatus comprising:
a substrate processing unit for performing a given processing to a substrate; and
a transport device that carries the substrate into and out of said substrate processing unit,
said substrate processing unit comprising:
a substrate support plate on which the substrate is placed;
a lifting device that lifts and lowers the substrate above said substrate support plate;
detector that detects a variation in the airflow in a space between the substrate and said substrate support plate when the substrate is lifted or lowered by said lifting device; and
a determiner that determines the position of the substrate on said substrate support plate based on the variation in the airflow detected by said detector.

* * * * *